US012748253B2

(12) United States Patent
Yuan et al.

(10) Patent No.: US 12,748,253 B2
(45) Date of Patent: Sep. 29, 2026

(54) COLOR LIQUID CRYSTAL DISPLAYS AND DISPLAY BACKLIGHTS

(71) Applicant: BRIDGELUX, INC., Fremont, CA (US)

(72) Inventors: Xianglong Yuan, Manteca, CA (US); Gang Wang, Sunnyvale, CA (US); Yi-Qun Li, Danville, CA (US)

(73) Assignee: BRIDGELUX, INC., Fremont, CA (US)

( * ) Notice: Subject to any disclaimer, the term of this patent is extended or adjusted under 35 U.S.C. 154(b) by 0 days.

(21) Appl. No.: 17/592,354

(22) Filed: Feb. 3, 2022

(65) Prior Publication Data

US 2022/0229222 A1 Jul. 21, 2022

Related U.S. Application Data

(63) Continuation of application No. 15/985,150, filed on May 21, 2018, now abandoned.

(Continued)

(51) Int. Cl.

*G02F 1/1335* (2006.01)
*F21V 8/00* (2006.01)

(Continued)

(52) U.S. Cl.

CPC ..... *G02B 6/0053* (2013.01); *G02F 1/133512* (2013.01); *G02F 1/133514* (2013.01);

(Continued)

(58) Field of Classification Search

CPC ......... G02F 1/133512; G02F 1/133514; G02F 1/133603; G02F 1/133614;

(Continued)

(56) References Cited

U.S. PATENT DOCUMENTS

| | | | |
|---|---|---|---|
| 8,957,585 | B2 | 2/2015 | Li |
| 2007/0221865 | A1 | 9/2007 | Sohn et al. |

(Continued)

FOREIGN PATENT DOCUMENTS

| | | | |
|---|---|---|---|
| CN | 103283046 | A | 9/2013 |
| CN | 106471598 | A | 3/2017 |

(Continued)

OTHER PUBLICATIONS

English Machine Translation of KR 20150072848 (Year: 2015).*

(Continued)

*Primary Examiner* — Zheng Song

(74) *Attorney, Agent, or Firm* — Vista IP Law Group, LLP

(57) ABSTRACT

A display includes a display panel and a backlight. The backlight includes an excitation source that generates blue excitation light with a dominant emission wavelength in a range 445 nm to 465 nm; and a wavelength converting film located remotely to the excitation source and between the excitation source and display panel. The wavelength converting film, in terms of photoluminescence material, includes a manganese-activated fluoride phosphor and a europium activated sulfide phosphor; where the manganese-activated fluoride phosphor receives at least a portion of the blue excitation light and in response emits red light with a peak emission wavelength in a range 610 nm to 650 nm; and where the europium activated sulfide phosphor receives at least a portion of the blue excitation light and in response emits green light having a peak emission wavelength in a range 525 nm to 545 nm; and where the europium activated sulfide phosphor is coated with at least one oxide material.

11 Claims, 16 Drawing Sheets

Related U.S. Application Data

(60) Provisional application No. 62/510,119, filed on May 23, 2017.

(51) Int. Cl.
*G02F 1/13357* (2006.01)
*H10H 20/80* (2025.01)
*H10H 20/851* (2025.01)

(52) U.S. Cl.
CPC ...... *G02F 1/133603* (2013.01); *G02B 6/0051* (2013.01); *G02B 6/0055* (2013.01); *G02B 6/0073* (2013.01); *G02F 1/133614* (2021.01); *G02F 1/133615* (2013.01); *G02F 1/133624* (2021.01); *H10H 20/8513* (2025.01); *H10H 20/882* (2025.01)

(58) Field of Classification Search
CPC ......... G02F 1/133615; G02F 1/133624; G02B 6/0051; G02B 6/0053; G02B 6/0055; G02B 6/0073; H01L 33/504; H01L 2933/0091
See application file for complete search history.

(56) References Cited

U.S. PATENT DOCUMENTS

| | | | | |
|---|---|---|---|---|
| 2009/0020775 | A1 | 1/2009 | Radkov et al. | |
| 2009/0195730 | A1* | 8/2009 | Park | G02F 1/133609 349/71 |
| 2010/0187975 | A1 | 7/2010 | Tsukahara et al. | |
| 2012/0113671 | A1 | 5/2012 | Sadasivan et al. | |
| 2012/0274878 | A1* | 11/2012 | Kunz | H01L 33/50 313/498 |
| 2013/0200413 | A1 | 8/2013 | Kashiwagi | |
| 2014/0293609 | A1* | 10/2014 | Daimon | H01L 33/504 362/293 |
| 2014/0333199 | A1* | 11/2014 | Wang | H01L 33/507 313/512 |
| 2015/0123153 | A1 | 5/2015 | Setlur et al. | |
| 2015/0124195 | A1 | 5/2015 | Chen et al. | |
| 2015/0286096 | A1* | 10/2015 | Kim | G02F 1/1336 977/774 |
| 2015/0301257 | A1 | 10/2015 | Choi et al. | |
| 2015/0340573 | A1 | 11/2015 | Yuan et al. | |
| 2016/0087164 | A1* | 3/2016 | Kawano | G02F 1/133514 257/98 |
| 2016/0097495 | A1* | 4/2016 | Yamamoto | H01L 33/54 349/65 |
| 2016/0097889 | A1 | 4/2016 | Kim et al. | |
| 2016/0104821 | A1* | 4/2016 | Hino | G02B 6/0073 362/293 |
| 2016/0141277 | A1 | 5/2016 | Stoll et al. | |
| 2016/0349432 | A1 | 12/2016 | Huang et al. | |
| 2017/0077360 | A1 | 3/2017 | Yang et al. | |
| 2017/0125650 | A1* | 5/2017 | Pickett | C09K 11/02 |
| 2017/0194535 | A1 | 7/2017 | Park et al. | |
| 2017/0254943 | A1* | 9/2017 | Murphy | G02F 1/133615 |
| 2017/0263592 | A1* | 9/2017 | Schmidt | F21V 9/30 |
| 2017/0329180 | A1 | 11/2017 | Hirayama et al. | |
| 2017/0343859 | A1* | 11/2017 | Chen | G02B 5/201 |
| 2017/0371205 | A1* | 12/2017 | Pellerite | G02F 1/133603 |
| 2018/0188610 | A1* | 7/2018 | Shimizu | G09G 3/20 |
| 2018/0252967 | A1 | 9/2018 | Li et al. | |
| 2020/0407627 | A1* | 12/2020 | Zhou | C09K 11/883 |

FOREIGN PATENT DOCUMENTS

| | | | | | |
|---|---|---|---|---|---|
| JP | 20070243135 | A | | 9/2007 | |
| JP | 2008280471 | A | | 11/2008 | |
| KR | 20150072848 | A | * | 6/2015 | G02F 1/133615 |
| KR | 1020150072848 | A | | 6/2015 | |
| KR | 20170052729 | A | * | 5/2017 | G02F 1/133524 |
| TW | 201643528 | A | | 12/2016 | |
| WO | 2006076737 | A2 | | 7/2006 | |
| WO | 2016106119 | A1 | | 6/2016 | |

OTHER PUBLICATIONS

English Machine Translation of KR-20170052729 (Year: 2017).*
International Search Report, PCT/US2018/033699.
Office Action, KR 10-2019-7038086, Jan. 11, 2021.
Office Action, TW App. No. 107117468, Jan. 2020.
Written Opinion, PCT/US2018/033699.
Office Action, May 2022, CN106471598A.
Office Action, Jun. 2023; CN 201880046440.
Office Action, Nov. 2023; CN201880046440.

* cited by examiner

COLOR LIQUID CRYSTAL DISPLAYS AND DISPLAY BACKLIGHTS

CROSS REFERENCE TO RELATED APPLICATIONS

This application is a continuation of U.S. Utility application Ser. No. 15/985,150, filed May 21, 2018, which claims the benefit of priority to U.S. Provisional Application No. 62/510,119, filed May 23, 2017, each of which is hereby incorporated by reference in its entirety.

FIELD OF THE INVENTION

The invention relates to color liquid crystal displays (LCDs) and in particular backlight arrangements for operating high color gamut color LCDs.

BACKGROUND OF THE INVENTION

Color LCDs find application in a variety of electronics devices including televisions, computer monitors, laptops, tablet computers and smart phones. As is known, most color LCDs comprise a liquid crystal (LC) display panel and a white light emitting backlight for operating the display panel.

The present invention intends to improve the color gamut of LCD backlights and color LCDs, where color gamut refers to the entire range of colors that the display can produce. The invention further intends to improve the luminous efficacy of LCD backlights and Color LCDs.

SUMMARY OF THE INVENTION

Embodiments of the invention concern color LCDs and display backlights that include red and green photoluminescence materials (e.g. phosphors, quantum dots, organic dyes or combinations thereof), which when excited by excitation light (typically blue) generate white light for operating the display.

In accordance with one or more embodiments, there is provided a backlight comprising a europium activated sulfide phosphor. The europium activated sulfide phosphor can have a general composition based on MA2S4:Eu, where M is at least one of Mg, Ca, Sr and Ba, A is at least one of Ga, Al, In, La and Y. In some embodiments, the europium activated sulfide phosphor comprises strontium, gallium and sulfur and has a general composition and crystal structure of SrGa2S4:Eu. In some embodiments, the europium activated sulfide phosphor has a general composition (M)(A)2S4:Eu, M', A' where M is at least one of Mg, Ca, Sr and Ba; M' is at least one of Li, Na and K; A is at least one of Ga, Al, and In; and A' is at least one of Si, Ge, La, Y and Ti. In this formula, the dopants Eu, M' and A' may be present in substitutional sites or interstitial sites. In some embodiments, the europium activated sulfide phosphor may have a composition (M,M')(A,A')2S4:Eu, wherein: M is at least one of Mg, Ca, Sr and Ba; M' is at least one of Li, Na and K; A is at least one of Ga, Al, In, La and Y; and A' is at least one of Si, Ge and Ti; wherein M' substitutes for M, and A' substitutes for A in the MA2S4 crystalline lattice. The red photoluminescence material and/or europium activated sulfide phosphor can comprise a wavelength converting layer that is located remotely to one or more light emitting devices that comprise an excitation source, typically a blue LED, for generating excitation light. In other embodiments, one or both of the red photoluminescence material and/or europium activated sulfide phosphor can be located in the one or more light emitting devices. Typically, the wavelength converting layer comprises a part of the backlight, though it may be considered to comprise a part of the display. The wavelength converting layer, which typically comprises a film, is of a size corresponding to size of the display. The wavelength converting layer can be incorporated with or used to replace the diffuser layer of known displays/backlights. The red photoluminescence material can comprise a phosphor material, quantum dots, organic dies and combination thereof.

According to one or more embodiments a display backlight comprises: an excitation source for generating blue excitation light with a dominant emission wavelength in a range 445 nm to 465 nm; a red photoluminescence material with a peak emission wavelength in a range 610 nm to 650 nm; a europium activated sulfide phosphor having a peak emission wavelength in a range 525 nm to 545 nm; and a wavelength converting layer located remotely to the excitation source, wherein the wavelength converting layer comprises at least one of the red photoluminescence material and the europium activated sulfide phosphor. In some embodiments, the europium activated sulfide phosphor generates light having a peak emission wavelength in a range 535 nm to 540 nm. A particular benefit of using a europium activated sulfide phosphor is that this can improve luminous efficacy of the backlight/display. The europium activated sulfide phosphor advantageously comprises strontium (Sr), gallium (Ga), and sulfur (S). In some embodiments, the europium activated sulfide phosphor has a general composition and crystal structure of SrGa2S4:Eu. The sulfide phosphor can comprise further elements such as alkaline earth metals or a halogen and can be coated to improve its reliability.

In some embodiments, the europium activated sulfide phosphor is located in the wavelength converting layer remote to the one or more light emitting devices including the excitation sources. Since some europium activated sulfide phosphors, more particularly SrGa2S4:Eu, may have problems with thermal quenching, locating this phosphor material in the wavelength converting layer remotely to the light emitting device (LED chip), provides a lower operating temperature environment for the phosphor can ameliorate the problems of thermal quenching. A further benefit of locating the europium activated sulfide phosphor in a separate wavelength converting layer and the red photoluminescence material in the one or more light emitting devices (that is, both the red and green are not located in the same physical location) is that this can improve luminous efficacy of the backlight. The increase in luminous efficacy results in part from the relative size difference between the light emitting device(s) (small area) and the wavelength converting layer (large area) and this difference in areas can minimize absorption of green light by the red photoluminescence material in the light emitting device(s). Additionally, by locating the green europium activated sulfide phosphor in the wavelength converting layer downstream of the light emitting device(s), longer wavelength (lower energy) red light which is incapable of exciting the europium activated sulfide phosphor will be able to pass through the wavelength converting layer with little or no absorption thereby improving luminous efficacy.

In embodiments, the red photoluminescence material can comprise a manganese-activated fluoride phosphor. In some embodiments, the manganese-activated fluoride phosphor comprises a manganese-activated potassium hexafluorosilicate phosphor of composition K2SiF6:Mn4+ (KSF) or a manganese-activated potassium hexafluorogermanate phosphor of composition K2GeF6:Mn4+ (KGF). The manganese-activated fluoride phosphor can comprise a phosphor of composition: K2TiF6:Mn4+, K2SnF6:Mn4+, Na2TiF6:Mn4+, Na2ZrF6:Mn4+, Cs2SiF6:Mn4+, Cs2TiF6:Mn4+, Rb2SiF6:Mn4+, Rb2TiF6:Mn4+, K3ZrF7:Mn4+, K3NbF7:Mn4+, K3TaF7:Mn4+, K3GdF6:Mn4+, K3LaF6:Mn4+ or K3YF6:Mn4+. When using a manganese-activated fluoride phosphor, more particularly though not exclusively KSF and/or KGF, it is preferably included with the one or more light emitting devices including the excitation source. A particular benefit of including KSF or KGF phosphor in the light emitting device(s) is a substantial reduction in phosphor usage compared with including it in the wavelength converting layer. KSF and KGF have a low blue (excitation) absorption efficiency requiring high material solid loadings in use. In large color LCDs such as televisions, computers and tablet computers, use of this material in the large area wavelength converting layer could be prohibitively expensive. In an embodiment of the invention the europium activated sulfide phosphor and red photoluminescence material are located in the wavelength converting layer.

In various embodiments of the invention, backlights comprising a red photoluminescence material and a green europium activated sulfide phosphor, such backlight can have an emission spectrum with a color gamut of at least 95% of NTSC (National Television System Committee) and/or at least 100% of DCI-P3 (Digital Cinema Initiatives) RGB color space standards. Such a color gamut is comparable to backlights based on QDs (non-cadmium containing) and exceeds known backlights composed of KSF and β-SiAlON. In this patent specification, a high color gamut backlight and/or color display refers to a backlight/display capable of producing light of colors that are at least 95% of NTSC and/or at least 100% of DCI-P3 RGB color space standards.

In various embodiments, the backlight can have an emission spectrum comprising red, green and blue emission peaks, wherein said red peak has chromaticity coordinates CIE x=0.6700 to 0.6950, CIE y=0.3300 to 0.2950; the green peak has chromaticity coordinates CIE x=0.1950 to 0.2950, CIE y=0.7250 to 0.6250; and the blue peak has chromaticity coordinates CIE x=0.1600 to 0.1400, CIE y=0.0180 to 0.0600.

In various embodiments, comprising a wavelength converting layer, the wavelength converting layer comprises a separate film that is fabricated separate to other components of the backlight. In other embodiments, the photoluminescence wavelength conversion layer can be fabricated as a part of another component of the backlight or display, for example it can be deposited directly onto a component of the backlight or display, that is, in direct contact with the component.

In various embodiments, backlights of the invention can comprise edge-lit or direct-lit arrangements.

In edge-lit arrangements, the backlight further comprises a light guide and the light emitting device is configured to couple light into at least one edge of the light guide and the wavelength converting layer is disposed adjacent to the light guide. In some embodiments, the wavelength converting layer is in direct contact with the light guide. To increase emission brightness, the backlight can further comprise a Brightness Enhancement Film (BEF) and the wavelength converting layer is disposed between the light guide and the brightness enhancement film. The wavelength converting layer can be in direct contact with the BEF.

In some edge-lit arrangements, the backlight can further comprise a light reflective surface and the wavelength converting layer be disposed between the light reflective surface and the light guide. The wavelength converting layer can be in direct contact with the light guide or in direct contact with the light reflective surface.

In direct-lit arrangements, the backlight can further comprise a Brightness Enhancement Film (BEF) and the wavelength converting layer is disposed adjacent to the brightness enhancement film. The wavelength converting layer can be in direct contact with the BEF.

In various embodiments of the invention, the wavelength converting layer can further comprise particles of a light scattering material. The inclusion of particles of a light scattering material can increase uniformity of light emission from the wavelength converting layer and can eliminate the need for a separate light diffusive layer as are commonly used in known displays. Additionally, incorporating particles of a light scattering material with the red or green photoluminescence materials of the wavelength converting layer can result in an increase in light generation by the photoluminescence wavelength conversion layer as well as a substantial, up to 40%, reduction in the quantity of photoluminescence material required to generate a given color of light. Given the relatively high cost of photoluminescence materials, the inclusion of a light scattering material can result in a significant reduction in manufacturing cost for larger displays such a tablet computers, laptops, TVs and monitors. Additionally, the light emitting device can further comprise particles of a light scattering material.

The light scattering material can comprise, for example, particles of zinc oxide (ZnO), silicon dioxide (SiO2), titanium dioxide (TiO2), magnesium oxide (MgO), barium sulfate (BaSO4), aluminum oxide (Al2O3), or combinations thereof. The light scattering material particles can have an average diameter such that they scatter excitation light more than photoluminescence generated red or green light. In some embodiments, the light diffusive material particles have an average diameter (D50) of 200 nm of less, typically 100 nm to 150 nm.

In accordance with one or more embodiments, there is provided a backlight in which the red and green photoluminescence materials are located at different physical locations along the light path of the backlight/display. For example, one of the red and green photoluminescence materials can be located within the one or more light emitting devices including the excitation source and the other photoluminescence material located in a photoluminescence wavelength converting layer that is located remotely to the one or more light emitting devices. In preferred embodiments, the red photoluminescence material is located within the one or more light emitting devices and the green photoluminescence material is located within the photoluminescence wavelength converting layer. In other embodiments, the red and green photoluminescence materials can be located in respective wavelength converting layers or within respective light emitting devices. The red and green photoluminescence materials can comprise a phosphor material, quantum dots, organic dies and combination thereof.

According to one or more embodiments a display backlight comprises: one or more light emitting devices comprising an excitation source for generating blue excitation light with a dominant emission wavelength in a range 445 nm to 465 nm and a red photoluminescence material with a peak emission wavelength in a range 610 nm to 650 nm; and a wavelength converting layer located remotely to the light emitting device; said wavelength converting layer comprising a green photoluminescence material with a peak emission wavelength in a range 525 nm to 545 nm. A particular benefit of locating the red photoluminescence material in the one or more light emitting device(s) and the green photoluminescence material in a separate wavelength converting layer (that is, both the red and green are not located in the same physical location) is that this can improve luminous efficacy of the backlight. As discussed above, the increase in luminous efficacy results in part from the size difference between the light emitting device(s) (small area) and the wavelength converting layer (large area) and this difference in areas can minimize absorption of green light by the red photoluminescence material in the light emitting device(s). Additionally, locating the green europium activated sulfide phosphor in the wavelength converting layer downstream of the light emitting device(s), enables longer wavelength red light to pass through the wavelength converting layer with little or no absorption thereby improving luminous efficacy. In one such arrangement, the green photoluminescence can comprise a β-SiAlON phosphor and the red photoluminescence material can comprise a Group IIA/IIB selenide sulfide-based phosphor, for example having a composition MSe1-xSx: Eu, wherein M is at least one of Mg, Ca, Sr, Ba and Zn and $0<x<1.0$.

The green photoluminescence material advantageously comprises a europium activated sulfide phosphor. The europium activated sulfide phosphor can have a general composition based on MA2S4:Eu, where M is at least one of Mg, Ca, Sr and Ba, A is at least one of Ga, Al, In, La and Y. In some embodiments, the europium activated sulfide phosphor comprises strontium, gallium, and sulfur and can have a general composition and crystal structure SrGa2S4:Eu. In some embodiments, the europium activated sulfide phosphor has a general composition (M)(A)2S4:Eu, M', A' where M is at least one of Mg, Ca, Sr and Ba; M' is at least one of Li, Na and K; A is at least one of Ga, Al, and In; and A' is at least one of Si, Ge, La, Y and Ti. In this formula, the dopants Eu, M' and A' may be present in substitutional sites or interstitial sites. In some embodiments, the europium activated sulfide phosphor may have a composition (M,M')(A,A')2S4:Eu, wherein: M is at least one of Mg, Ca, Sr and Ba; M' is at least one of Li, Na and K; A is at least one of Ga, Al, In, La and Y; and A' is at least one of Si, Ge and Ti; wherein M' substitutes for M, and A' substitutes for A in the MA2S4 crystalline lattice. The sulfide phosphor can comprise further elements such as alkaline earth metals or a halogen. A particular benefit of using a europium activated sulfide phosphor is that this can improve luminous efficacy. Since SrGa2S4:Eu can have problems with thermal quenching, locating this phosphor material in the wavelength converting layer remotely to the light emitting device (LED chip), provides a lower operating temperature environment for the phosphor can ameliorate the problems of thermal quenching.

Additionally or alternatively, the green photoluminescence can comprise a quantum dot material.

In embodiments, the red photoluminescence material can comprise a manganese-activated fluoride phosphor. In some embodiments, the manganese-activated fluoride phosphor comprises a manganese-activated potassium hexafluorosilicate phosphor of composition K2SiF6:Mn4+ (KSF) or a manganese-activated potassium hexafluorogermanate phosphor of composition K2GeF6:Mn4+ (KGF). A particular benefit of using KSF or KGF phosphor in the light emitting device(s) is a substantial reduction in red phosphor usage compared with including it in the wavelength converting layer. KSF and KGF have a low blue (excitation) absorption efficiency requiring high material solid loadings in use. In large color LCDs such as televisions, computers and tablet computers, use of this material in the large area wavelength converting layer would be prohibitively expensive. A further advantage when using SrGa2S4:Eu phosphor in in the wavelength converting layer is to avoid it chemically reacting with KSF or KGF phosphors. In other embodiments, the manganese-activated fluoride phosphor can comprise a phosphor of composition selected from the group consisting of: K2TiF6:Mn4+, K2SnF6:Mn4+, Na2TiF6:Mn4+, Na2ZrF6:Mn4+, Cs2SiF6:Mn4+, Cs2TiF6:Mn4+, Rb2SiF6:Mn4+, Rb2TiF6:Mn4+, K3ZrF7:Mn4+, K3NbF7:Mn4+, K3 TaF7:Mn4+, K3 GdF6:Mn4+, K3LaF6:Mn4+ and K3YF6:Mn4+.

In various embodiments of the invention, backlights comprising a manganese-activated fluoride red phosphor and a green sulfide phosphor, such backlight can have an emission spectrum with a color gamut of at least 95% of NTSC (National Television System Committee) and/or at least 100% of DCI-P3 (Digital Cinema Initiatives) RGB color space standards. Such a color gamut is comparable to backlights based on QDs (non-cadmium containing) and exceeds that of known backlights composed of KSF and β-SiAlON. In this patent specification, a high color gamut backlight and/or color display refers to a backlight/display capable of producing light of colors that are at least 95% of NTSC and/or at least 100% of DCI-P3 RGB color space standards.

In various embodiments, the backlight can have an emission spectrum comprising red, green and blue emission peaks, wherein said red peak has chromaticity coordinates CIE x=0.6700 to 0.6950, CIE y=0.3300 to 0.2950; the green peak has chromaticity coordinates CIE x=0.1950 to 0.2950, CIE y=0.7250 to 0.6250; and the blue peak has chromaticity coordinates CIE x=0.1600 to 0.1400, CIE y=0.0180 to 0.0600.

In various embodiments, the wavelength converting layer comprises a separate film that is fabricated separate to other components of the backlight. In other embodiments, the photoluminescence wavelength conversion layer can be fabricated as a part of another component of the backlight or display, for example it can be deposited directly onto a component of the backlight or display, that is, in direct contact with the component.

In various embodiments, backlights of the invention can comprise edge-lit or direct-lit arrangements.

In edge-lit arrangements, the backlight further comprises a light guide and the light emitting device is configured to couple light into at least one edge of the light guide and the wavelength converting layer is disposed adjacent to the light guide. In some embodiments, the wavelength converting layer is in direct contact with the light guide. To increase emission brightness, the backlight can further comprise a Brightness Enhancement Film (BEF) and the wavelength converting layer is disposed between the light guide and the brightness enhancement film. The wavelength converting layer can be in direct contact with the BEF.

In some edge-lit arrangements the backlight can further comprise a light reflective surface and the wavelength converting layer be disposed between the light reflective surface and the light guide. The wavelength converting layer can be in direct contact with the light guide or in direct contact with the light reflective surface.

In direct-lit arrangements, the backlight can further comprise a Brightness Enhancement Film (BEF) and the wavelength converting layer is disposed adjacent to the brightness enhancement film. The wavelength converting layer can be in direct contact with the BEF.

In various embodiments of the invention, the wavelength converting layer can further comprise particles of a light scattering material. The inclusion of particles of a light scattering material can increase uniformity of light emission from the wavelength converting layer and can eliminate the need for a separate light diffusive layer as are commonly used in known displays. Additionally, incorporating particles of a light scattering material with the red or green photoluminescence materials of the wavelength converting layer can result in an increase in light generation by the photoluminescence wavelength conversion layer as well as a substantial, up to 40%, reduction in the quantity of photoluminescence material required to generate a given color of light. Given the relatively high cost of photoluminescence materials, the inclusion of a light scattering material can result in a significant reduction in manufacturing cost for larger displays such a tablet computers, laptops, TVs and monitors. Additionally, the light emitting device can further comprise particles of a light scattering material.

The light scattering material can comprise, for example, particles of zinc oxide (ZnO), silicon dioxide (SiO2), titanium dioxide (TiO2), magnesium oxide (MgO), barium sulfate (BaSO4), aluminum oxide (Al2O3), or combinations thereof. The light scattering material particles can have an average diameter such that they scatter excitation light more than photoluminescence generated red or green light. In some embodiments, the light diffusive material particles have an average diameter (D50) of 200 nm of less, typically 100 nm to 150 nm.

According to one or more embodiments, there is contemplated a display backlight comprising: a light emitting device comprising an excitation source for generating blue excitation light with a dominant emission wavelength in a range 445 nm to 465 nm and a manganese-activated potassium hexafluorosilicate phosphor of composition K2SiF6:Mn4+; and a wavelength converting layer located remotely to the light emitting device, and comprising a green photoluminescence material having a peak emission wavelength in a range 525 nm to 545 nm, said green photoluminescence material comprising strontium, gallium, and sulfur having general composition and crystal structure of SrGa2S4:Eu.

The green photoluminescence material in the wavelength converting layer can comprise a europium activated sulfide phosphor comprising strontium, gallium, and sulfur.

The europium activated sulfide phosphor can have a general composition and crystal structure of SrGa2S4:Eu.

According to one or more embodiments, there is contemplated a display backlight comprises a light emitting device comprising an excitation source for generating blue excitation light with a dominant emission wavelength in a range 445 nm to 465 nm and a red photoluminescence material with a peak emission wavelength in a range 610 nm to 650 nm; and a wavelength converting layer located remotely to the light emitting device; said wavelength converting layer comprising a green photoluminescence material with a peak emission wavelength in a range 525 nm to 545 nm, said green photoluminescence material comprising a quantum dot material.

BRIEF DESCRIPTION OF THE DRAWINGS

In order that the present invention is better understood, embodiments of the invention will now be described, by way of example only, with reference to the accompanying drawings in which.

DETAILED DESCRIPTION OF THE INVENTION

Figure 1:
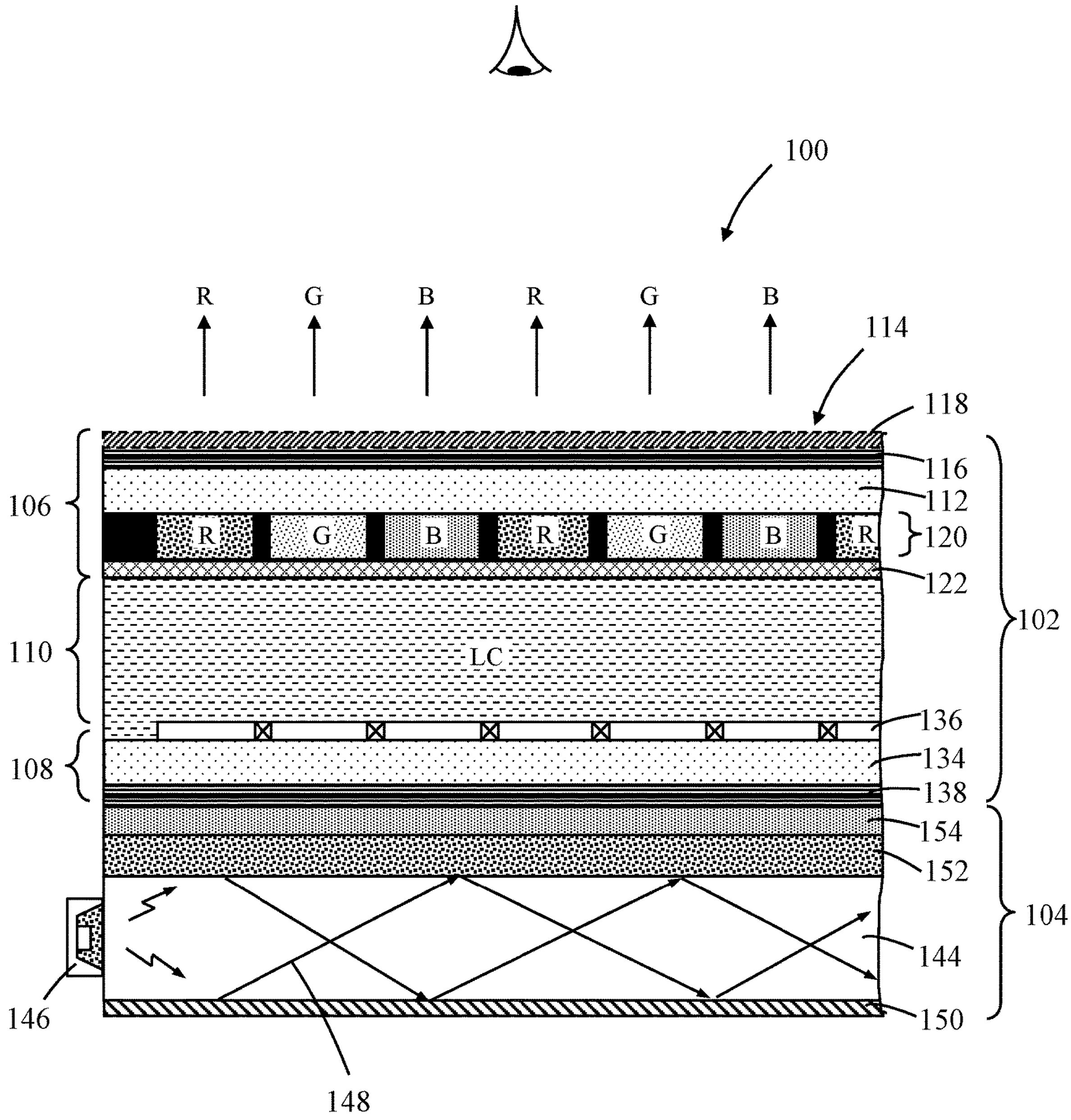
FIG. 1 is a schematic cross-sectional representation of a color LCD in accordance with an embodiment of the present invention.

Embodiments of the invention concern color LCD backlights that include red-emitting and green-emitting photoluminescence materials (e.g. phosphors, quantum dots and/or organic dyes), which when excited by excitation light (typically blue light) generate a combined white light output for operating the display.

In accordance with some embodiments of the invention a backlight comprises a europium activated sulfide phosphor such as for example a europium activated sulfide phosphor of general composition based on MA2S4:Eu, where M is at least one of Mg, Ca, Sr and Ba, A is at least one of Ga, Al, In, La and Y. In some embodiments, the europium activated sulfide phosphor has a general composition and crystal structure of SrGa2S4:Eu. The sulfide phosphor can comprise further elements such as a halogen and can be coated to improve its reliability. The red photoluminescence material and/or europium activated sulfide phosphor can comprise a wavelength converting layer that is located remotely to one or more light emitting devices that comprise an excitation source, typically a blue LED, for generating excitation light. In other embodiments one or both of the red photoluminescence material and/or europium activated sulfide phosphor can be located in the one or more light emitting devices. Typically, the wavelength converting layer comprises a part of the backlight, though it may be considered to comprise a part of the display. The wavelength converting layer, which typically comprises a film, is of a size corresponding to size of the display. The wavelength converting layer can be incorporated with or used to replace the diffuser layer of the known displays/backlights. The red photoluminescence material can comprise a phosphor material, quantum dots, organic dies and combination thereof.

In accordance with other embodiments of the invention a backlight comprises locating the red and green photoluminescence materials at different physical locations along the light path of the backlight/display. For example, the red and green photoluminescence materials can be located within separate components of the backlight, i.e. at separate physical locations, with one photoluminescence material being located in a light emitting package containing an excitation source, typically a blue LED and the other photoluminescence material being located in a photoluminescence wavelength converting layer that is located remotely to the light emitting package. "Remotely" in this specification means two components which are spatially separated such as to reduce transfer of heat between components. The components can be separated by air or a light transmissive medium. In preferred embodiments, the red photoluminescence material is located within the one or more light emitting devices and the green photoluminescence material is located within the photoluminescence wavelength converting layer. In other embodiments, the red and green photoluminescence materials can be located in respective wavelength converting layers 152*a*, 152*b* (FIG. 16) or within respective light emitting devices. A particular benefit of locating the red photoluminescence material in the one or more light emitting device(s) and the green photoluminescence material in a separate wavelength converting layer is that this can improve luminous efficacy of the backlight.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration. Throughout this specification like reference numerals are used to denote like features.

Referring to FIG. 1 there is shown a schematic cross-sectional representation of a light transmissive Color LCD (Liquid Crystal Display) 100 formed in accordance with an embodiment of the invention. The Color LCD 100 comprises a LC (Liquid Crystal) Display Panel 102 and a Display Backlight 104. The Backlight 104 (FIGS. 7-9) is operable to generate white light 140 for operating the LC Display Panel 102.

LC Display Panel

As shown in FIG. 1, the LC display panel 102 comprises a transparent (light transmissive) Front (light/image emitting) Plate 106, a transparent Back Plate 108 and a Liquid Crystal (LC) 110 filling the volume between the Front and Back Plates 106, 108.

Figure 2:
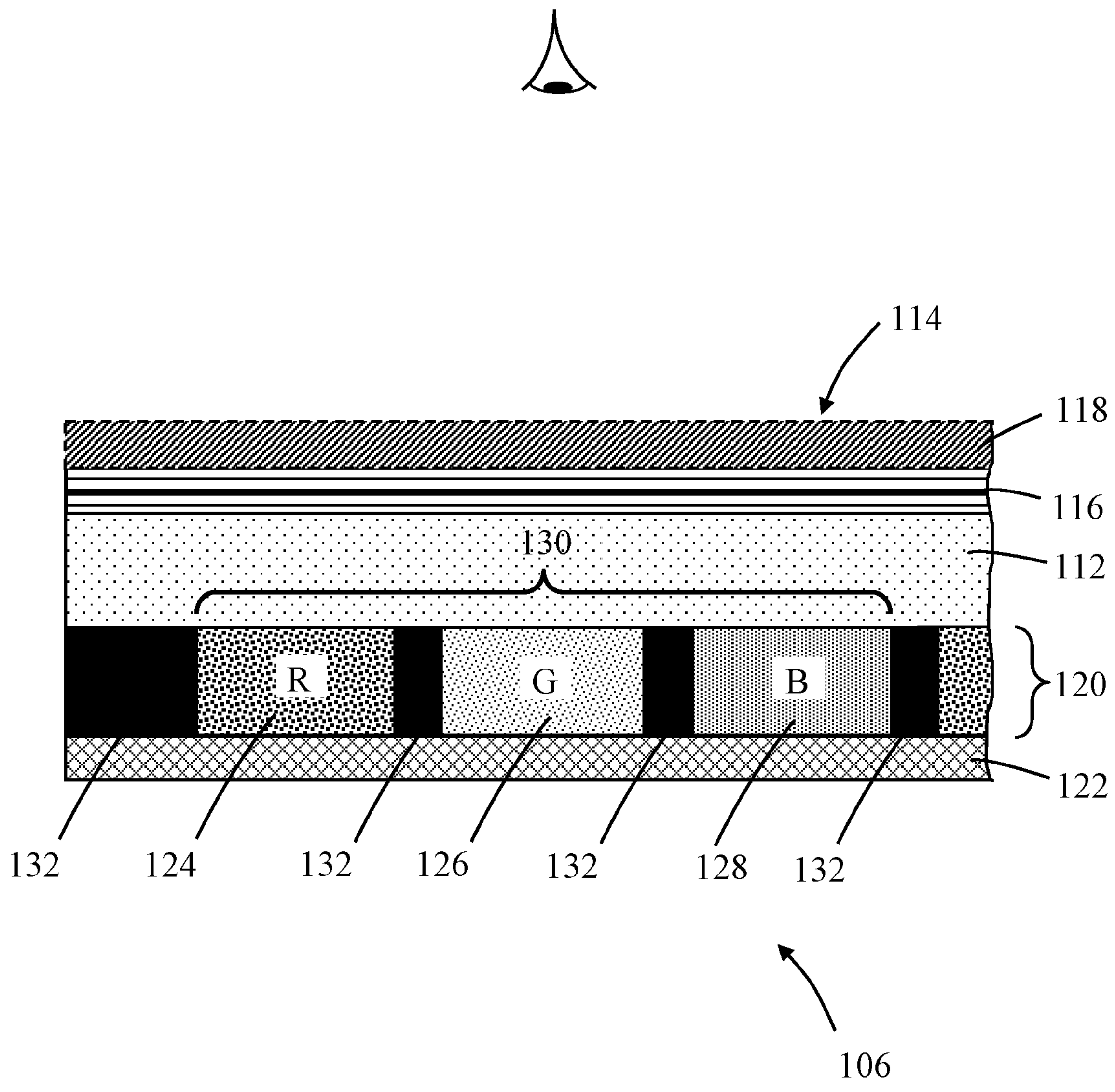
FIG. 2 is a schematic cross-sectional representation of a front plate of the color LCD of FIG. 1.

As shown in FIG. 2, the Front Plate 106 can comprise a glass plate 112 having on its upper surface, that is the face of the plate comprising the viewing face 114 of the display, a first polarizing filter layer 116. Optionally, the outermost viewing surface of the front plate can further comprise an anti-reflective layer 118. On its underside, that is the face of the front plate 106 facing the liquid crystal (LC) 110, the glass plate 112 can further comprise a color filter plate 120 and a light transmissive common electrode plane 122 (for example transparent Indium Tin Oxide, ITO).

Figure 3:
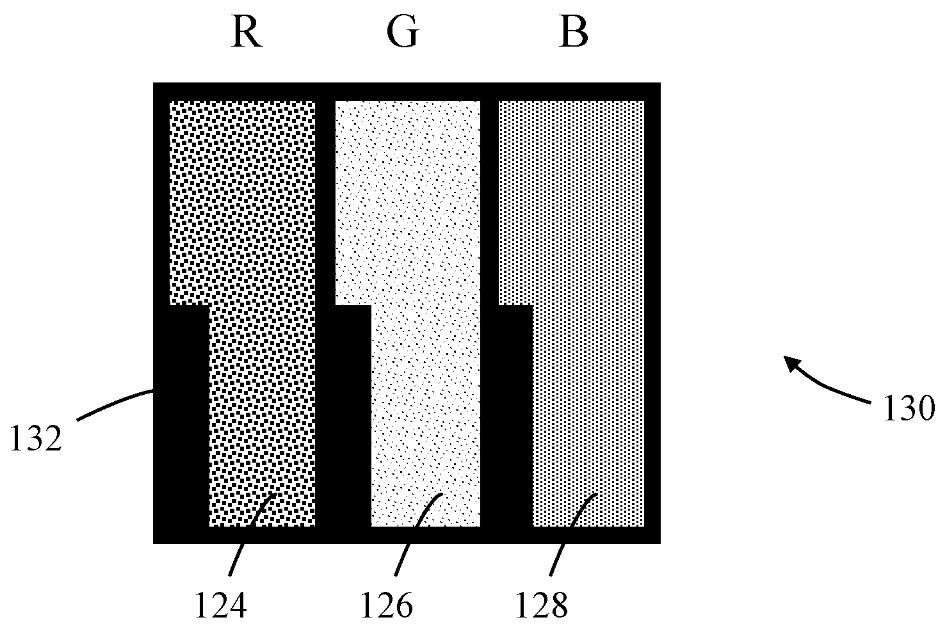
FIG. 3 is a schematic diagram of a unit pixel of a color filter plate of the color LCD of FIG. 1.
Figure 4:
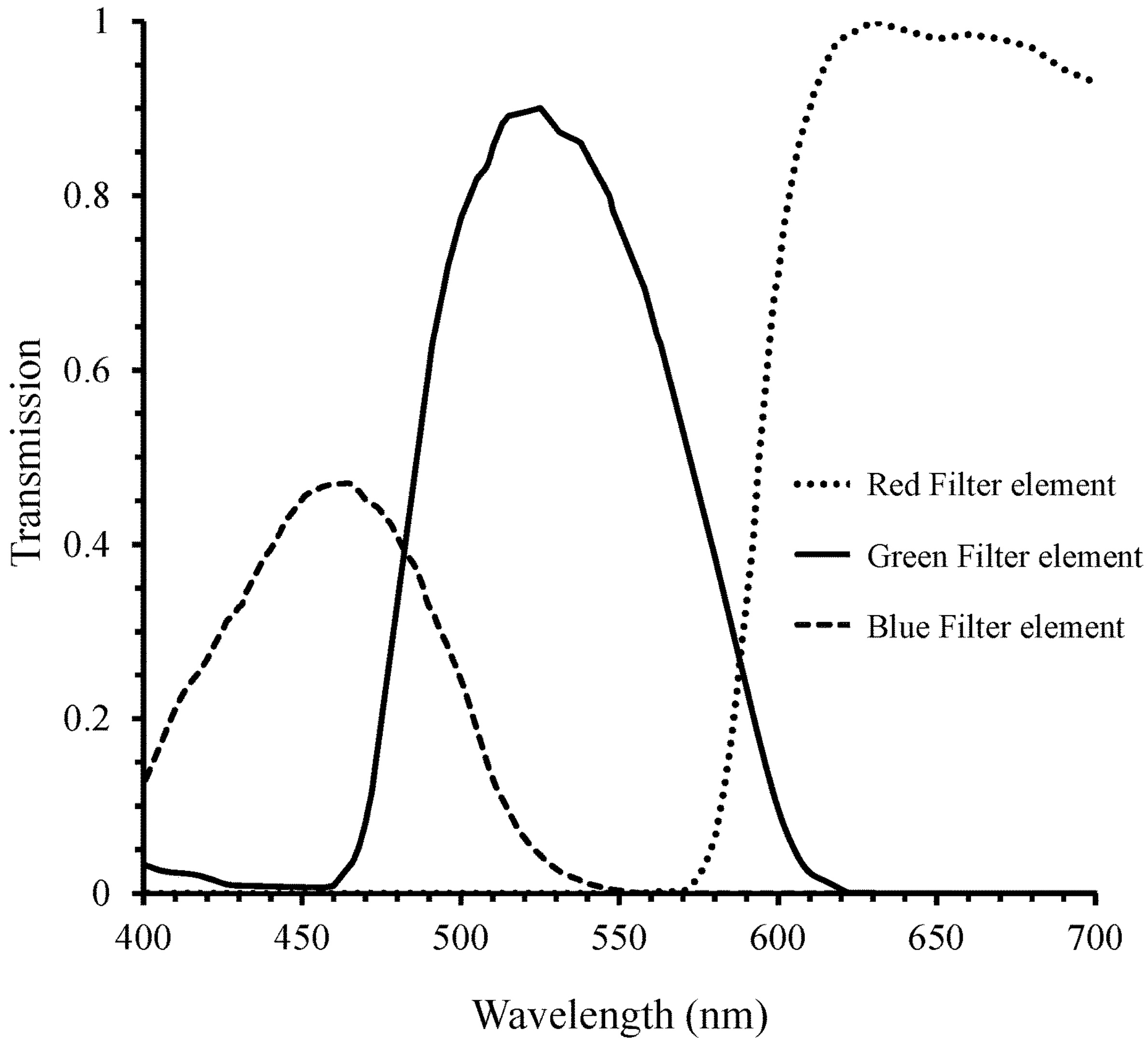
FIG. 4 shows the filtering characteristics, light transmission versus wavelength, for red, green and blue filter elements of a color filter plate of a color LCD display according to an embodiment of the invention.

The color filter plate 120 comprises an array of different color sub-pixels filter elements 124, 126, 128 which respectively allow transmission of red (R), green (G), and blue (B) light. Each unit pixel 130 of the display comprises a group of three sub-pixels filter elements 124, 126, 128. FIG. 3 is a schematic diagram of a unit pixel 130 of the color filter plate 132. As shown, each RGB sub-pixel 124, 126, 128 comprises a respective color filter pigment, typically an organic dye, which allows passage of light corresponding to the color of the sub-pixel only. The RGB sub-pixel elements 124, 126, 128 can be deposited on the glass plate 112 with opaque dividers/walls (black matrix) 132 between each of the sub-pixels 124, 126, 128. The black matrix 132 can be formed as a grid mask of metal, such as for example chromium, defining the sub-pixels 124, 126, 128 and providing an opaque gap between the sub-pixels and unit pixels 130. To minimize reflection from the black matrix, a double layer of Cr and CrOx may be used, but of course, the layers may comprise materials other than Cr and CrOx. The black matrix film which can be sputter-deposited underlying or overlying the photoluminescence material may be patterned using methods that include photolithography. FIG. 4 shows the filtering characteristics, light transmission versus wavelength, for red (R), green (G) and blue (B) filter elements of a Hisense filter plate optimized for TV applications.

Figure 5:
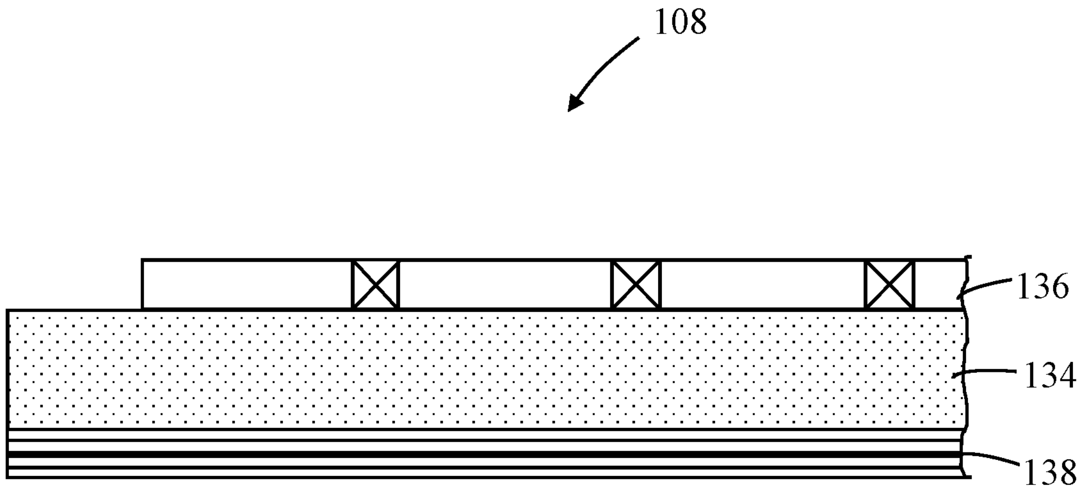
FIG. 5 is a schematic cross-sectional representation of a back plate of the color LCD of FIG. 1.

Referring to FIG. 5, the back plate 108 can comprise a glass plate 134 having on its upper surface (the surface facing the LC) a TFT (Thin Film Transistor) layer 136. The TFT layer 136 comprises an array of TFTs, in which there is a transistor corresponding to each individual color sub-pixel 124, 126, 128 of each unit pixel 130. Each TFT is operable to selectively control passage of the light to its corresponding sub-pixel. On a lower surface of the glass plate 134 there is provided a second polarizing filter layer 138. The directions of polarization of the two polarizing filters 116 and 138 are aligned perpendicular to one another.

Backlight

The Backlight 104 is operable to generate and emit white light 140 from a front light emitting face 142 (upper face that faces the rear of the Display Panel, FIG. 7) for operating the LC Display Panel 102.

Backlight: Light Emitting Device

Figure 6:
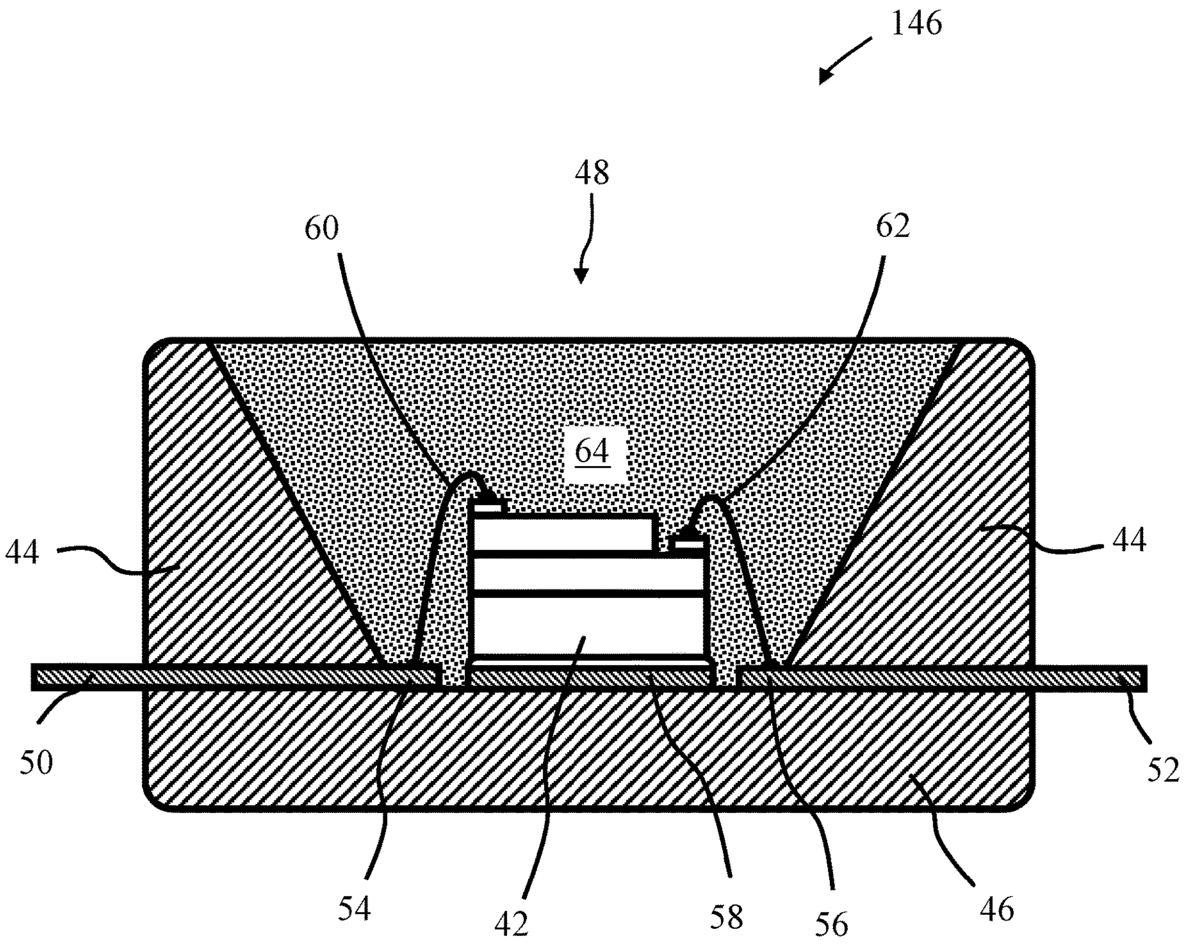
FIG. 6 is a cross-sectional side view of a light emitting device in accordance with an embodiment of the invention.

FIG. 6 is a schematic cross-sectional representation of a light emitting device 146 according to some embodiments. The light emitting device 146 is operable to generate composite light comprising a combination of blue excitation light and one of red (peak emission wavelength 610 nm-650 nm) or green (peak emission wavelength 530 nm-545 nm) photoluminescence light.

As shown in FIG. 6, the device 146 can comprise a blue light emitting GaN LED chip 42 (dominant emission wavelength 445 nm-465 nm), preferably 445 nm-455 nm, housed within a package. The package, which can for example comprise a low temperature co-fired ceramic (LTCC) or high temperature polymer, comprises upper and lower body parts 44, 46. The upper body part 44 defines a recess 48, often circular in shape, which is configured to receive one or more LED chip(s) 42. The package further comprises electrical connectors 50 and 52 that also define corresponding electrode contact pads 54 and 56 on the floor of the recess 48. Using for example adhesive or solder, the LED chip 42 can be mounted to a thermally conductive pad 58 located on the floor of the recess 48. The LED chip's electrode pads are electrically connected to corresponding electrode contact pads 54 and 56 on the floor of the package using bond wires 60 and 62 and the recess 48 is completely filled with a light transmissive (transparent) polymer material 64, typically a silicone, which is loaded with a photoluminescence material, such as a phosphor, such that the exposed surfaces of the LED chip 42 are covered by the phosphor/polymer material mixture. To enhance the emission brightness of the device the walls of the recess 48 can be inclined and have a light reflective surface. In accordance with the invention the photoluminescence material comprises either a green- or a red-emitting photoluminescence material. In preferred embodiments, the red or green photoluminescence materials comprise narrow-band phosphors. In operation the light emitting device 146 generates composite light 148 comprising a combination of blue excitation light from the LED chip 42 and photoluminescence light generated by the photoluminescence material in response to excitation by the blue excitation light. Depending on the photoluminescence material present in the light emitting device, the photoluminescence light can be green or red.

Figure 7:
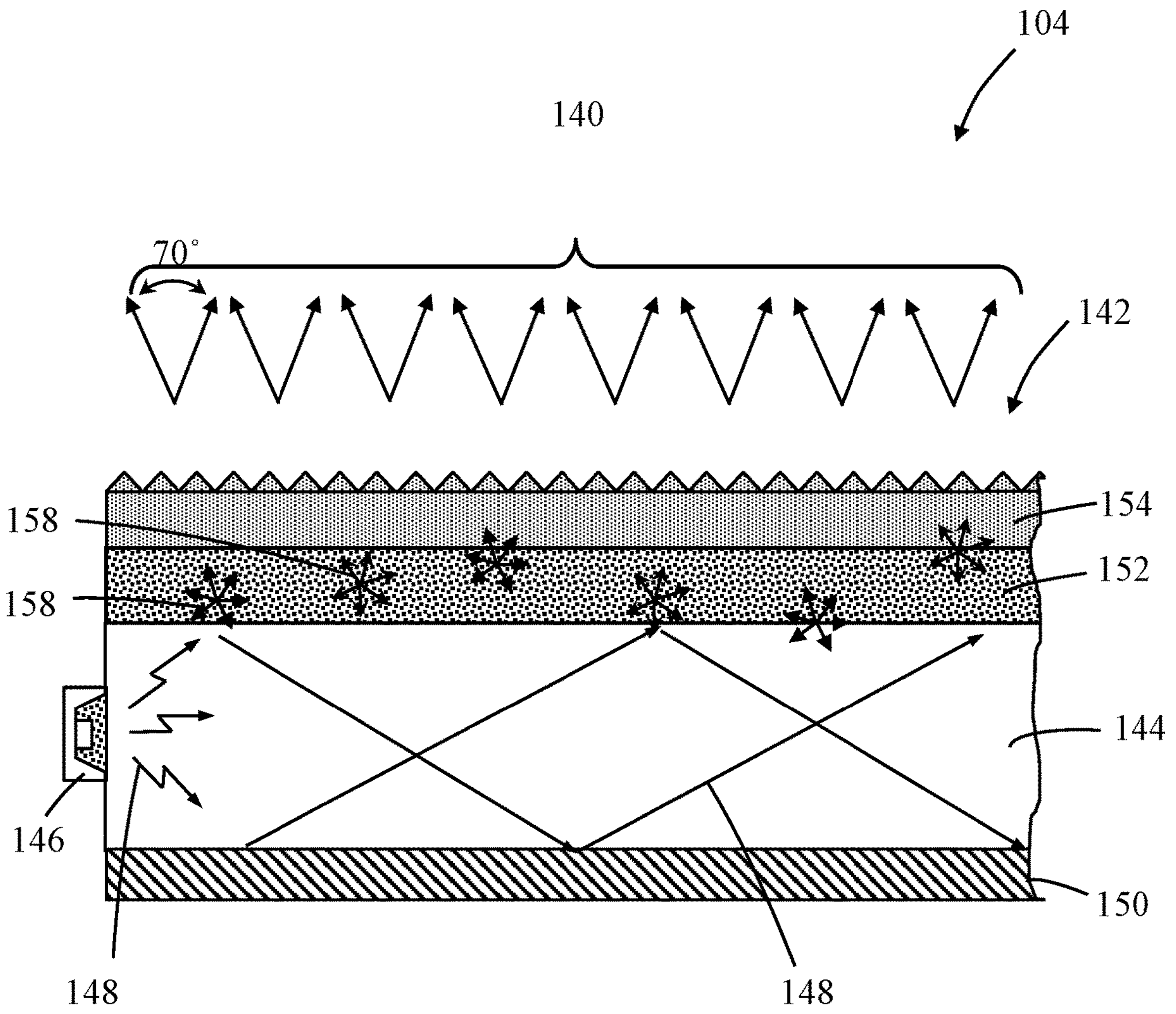
FIG. 7 is a schematic cross-sectional representation of an edge-lit backlight of the color LCD of FIG. 1 in which a photoluminescence layer is located between a light guide and a BEF (Brightness Enhancement Film)

As shown in FIG. 7, the backlight 104 can comprise an edge-lit arrangement comprising a light guide (waveguide) 144 with one or more light emitting devices 146 located along one or more edges of the light guide 144. As indicated, the light guide 144 can be planar; though, in some embodiments, it can be tapered (wedge-shaped) for promoting a more uniform emission of composite-light from a front light emitting face (upper face as shown in FIG. 7 that faces the Display Panel) of the light guide. The light emitting devices 146 are configured such that in operation, they generate composite light 148 which is coupled into one or more edges of the light guide 144 and then guided, by total internal reflection, throughout the volume of the light guide 144 and finally emitted from the front face (upper face that faces the Display Panel 102) of the light guide 144. As shown in FIG. 7, and to prevent the escape of light from the backlight 104, the rear face (lower face as shown) of the light guide 144 can comprise a light reflective layer (surface) 150 such as Vikuiti™ ESR (Enhanced Spectral Reflector) film from 3M.

On a front light emitting face (upper face as shown) of the light guide 144 there is provided a photoluminescence wavelength converting layer 152 and a Brightness Enhancement Film (BEF) 154. In the embodiment illustrated in FIG. 7 the photoluminescence wavelength converting layer 152 is disposed between the light guide 144 and BEF 154.

Backlight: Brightness Enhancement Film (BEF)

The Brightness Enhancement Film (BEF), also known as a Prism Sheet, comprises a precision micro-structured optical film and controls the emission of light 140 from the backlight within a fixed angle (typically 70 degrees), thereby increasing luminous efficacy of the backlight. Typically, the BEF comprises an array of micro-prisms on a light emitting face of the film and can increase brightness by 40-60%. The BEF 154 can comprise a single BEF or a combination of multiple BEFs and in the case of the latter even greater increases in brightness can be achieved. Examples of suitable BEFs include Vikuiti™ BEF II from 3M or prism sheets from MNTech. In some embodiments, the BEF 154 can comprise a Multi-Functional Prism Sheet (MFPS) that integrates a prism sheet with a diffusion film and can have a better luminous efficiency than a normal prism sheet. In some embodiments, the BEF 154 can comprise a Micro-Lens Film Prism Sheet (MLFPS) such as those available from MNTech.

Backlight: Photoluminescence Wavelength Converting Layer

For the sake of brevity, in the following description the photoluminescence wavelength converting layer will be referred to as the "photoluminescence layer".

The photoluminescence layer 152 contains either a red- or green-emitting photoluminescence material and in operation converts at least a portion of the blue excitation light of the composite light 148 generated by the device 146 to produce a white light emission product 140 for operating the LC display panel 104. More specifically, the photoluminescence layer 152 contains either a blue light excitable red-emitting (Peak emission wavelength $\lambda pe=600$ nm-650 nm) photoluminescence material or a green-emitting (Peak emission wavelength $\lambda pe=530$ nm-545 nm) photoluminescence material. The combination of photoluminescence generated light 158 and composite light 148 results in a white light emission product 140. To optimize the efficacy and color gamut of the display, the red- and green-emitting photoluminescence materials are selected to match their peak emission (PE) wavelength $\lambda pe$ with the transmission characteristic of their corresponding color filter elements. Preferably, the green-emitting photoluminescence material has a peak emission wavelength $\lambda pe \approx 535$ nm. In order to maximize display color gamut and efficacy, the red-emitting and/or green-emitting photoluminescence materials present in the light emitting device 146 and photoluminescence layer 152 preferably comprise narrow-band photoluminescence materials having an emission peak with a FWHM (Full Width Half Maximum) of about 50 nm of less.

The red- and green-emitting photoluminescence materials can comprise phosphor materials, quantum dots (QDs), organic dyes or combinations thereof. For the purposes of illustration only, the current description specifically refers to photoluminescence materials embodied as phosphor materials. The phosphor materials can comprise inorganic and organic phosphor materials. Inorganic phosphors can comprise aluminate, silicate, phosphate, borate, sulfate, chloride, fluoride or nitride phosphor materials. As is known phosphor materials are doped with a rare-earth element called an activator. The activator typically comprises divalent europium, cerium or tetravalent manganese. Dopants such as halogens can be substitutionally or interstitially incorporated into the crystal lattice and can for example reside on lattice sites of the host material and/or interstitially within the host material.

Red-Emitting Phosphor Materials

In this patent specification, a red-emitting phosphor refers to a phosphor material which generates light having a peak emission wavelength in a range 610 nm-650 nm, that is in the orange to red region of the visible spectrum. Preferably, the red-emitting phosphor is a narrow-band phosphor material and has a full width at half maximum emission intensity of less than about 50 nm. Examples of suitable red-emitting phosphor materials for use in the light emitting device 146 and photoluminescence layer 152 are given in Table 1.

TABLE 1

| Red-emitting phosphors | | | | |
|---|---|---|---|---|
| Phosphor family | | Composition | λpe (nm) | FWHM (nm) |
| Hexafluorosilicate | KSF | $K_2SiF_6:Mn^{4+}$ | ≈632 | ≈10 |
| Hexafluorotitanate | KTF | $K_2TiF_6:Mn^{4+}$ | ≈632 | ≈10 |
| Hexafluorogermanate | KGF | $K_2GeF_6:Mn^{4+}$ | ≈632 | ≈10 |
| Selenide sulfide | CSS | $MSe_{1-x}S_x$: Eu<br>M = Mg, Ca, Sr and/or Ba | 600-635 | 50-55 |
| Selenide sulfide | CSS | CaSeS:Eu | 610-635 | 50-55 |
| Silicon-nitride 1:1:1:3 | CASN | $CaAlSiN_3$:Eu<br>$(Ca_{1-x}Sr_x)AlSiN_3$:Eu | 625-650 | ≈75 |

Narrow-Band Red Phosphors: Manganese-Activated Fluoride Phosphors

An example of a manganese-activated fluoride phosphor is manganese-activated potassium hexafluorosilicate phosphor (KSF)—K2SiF6:Mn4+. An example of such a phosphor is NR6931 KSF phosphor from Intematix Corporation, Fremont California, USA which has a peak emission wavelength of about 632 nm. KSF phosphor is excitable by blue excitation light and generates red light with a peak emission wavelength (λpe) of between about 631 nm and about 632 nm with a FWHM of ~5 nm to ~10 nm (depending on the way it is measured: i.e. whether the width takes account of a single or double peaks). Other manganese-activated phosphors can include: K2GeF6:Mn4+, K2TiF6:Mn4+, K2SnF6:Mn4+, Na2TiF6:Mn4+, Na2ZrF6:Mn4+, Cs2SiF6:Mn4+, Cs2TiF6:Mn4+, Rb2SiF6:Mn4+, Rb2TiF6:Mn4+, K3ZrF7:Mn4+, K3NbF7:Mn4+, K3TaF7:Mn4+, K3GdF6:Mn4+, K3LaF6:Mn4+ and K3YF6:Mn4+.

Narrow-Band Red Phosphors: Group IIA/IIB Selenide Sulfide-Based Phosphors

An example of a Group IIA/BB selenide sulfide-based phosphor material has a composition MSe1-xSx:Eu, wherein M is at least one of Mg, Ca, Sr, Ba and Zn and 0<x<1.0. A particular example of this phosphor material is CSS phosphor (CaSe1-xSx:Eu). Details of CSS phosphors are provided in co-pending U.S. patent application Ser. No. 15/282,551 filed 30 Sep. 2016, which is hereby incorporated by reference in its entirety. The CSS narrow-band red phosphors described in U.S. patent application Ser. No. 15/282,551 can be used in the present invention. The peak emission wavelength of CSS phosphors can be tuned from 600 nm to 650 nm by changing the ratio of S/Se in the composition and exhibits a narrow-band red emission spectrum with FWHM in the range ~48 nm to ~60 nm (longer wavelength typically has a larger FWHM value).

Green-Emitting Phosphor Materials

In this patent specification, a green-emitting phosphor refers to a phosphor material which generates light having a peak emission wavelength in a range 525 nm to 545 nm, that is in the green red region of the visible spectrum. In some embodiments, the green-emitting phosphor generates light having a peak emission wavelength in a range 535 nm to 540 nm. Preferably, the green-emitting phosphor is a narrow-band phosphor material and has a full width at half maximum emission intensity of less than about 50 nm. Examples of suitable green-emitting phosphor materials for use in the light emitting device 146 and photoluminescence layer 152 are given in Table 2.

TABLE 2

| Green-emitting phosphor materials | | | | |
|---|---|---|---|---|
| Phosphor family | | Composition | λpe (nm) | FWHM (nm) |
| Sulfide | | $MA_2S_4$:Eu<br>M = Mg, Ca, Sr and/or Ba<br>A = Ga, Al, In, La and/or Y | 525-545 | 48-50 |
| Sulfide | | $SrGa_2S_4$:Eu | 525-545 | 48-50 |
| Sulfide | | $(M)(A)_2S_4$:Eu, M', A'<br>M = Mg, Ca, Sr and/or Ba<br>A = Ga, Al and/or In<br>M' = Li, Na and/or K<br>A' = Si, Ge, La, Y and/or Ti | 525-545 | 48-50 |
| Sulfide | | $(M,M')(A,A')_2S_4$:Eu<br>M = Mg, Ca, Sr and/or Ba<br>A = Ga, Al, In, La and/or Y<br>M' = Li, Na and/or K<br>A' = Si, Ge and/or Ti | 525-545 | 48-50 |
| β-SiAlON | | $M_xSi_{12-(m+n)}Al_{m+n}O_nN_{16-n}$:Eu<br>M = Mg, Ca and/or Sr | 525-545 | 50-52 |
| Aluminate | YAG | $Y_3(Al_{1-x}Ga_x)_5O_{12}$: Ce | 500-550 | ≈110 |
| Aluminate | LuAG | $Lu_3(Al_{1-x}M_x)_5O_{12}$: Ce | 500-550 | ≈110 |
| Silicate | | $A_2SiO_4$:Eu<br>A = Mg, Ca, Sr and/or Ba | 500-550 | ≈70 |
| Silicate | | $(Sr_{1-x}Ba_x)_2SiO_4$: Eu | 500-550 | ≈70 |

Green-Emitting Phosphor Materials: Green Sulfide Phosphors

An example of a green sulfide phosphor material has a general composition based on MA2S4:Eu, where M is at least one of Mg, Ca, Sr and Ba, A is at least one of Ga, Al, In, La and Y. To improve reliability, the phosphor particles can be coated with one or more oxides chosen from the group of materials consisting of aluminum oxide, silicon oxide, titanium oxide, zinc oxide, magnesium oxide, zirconium oxide and chromium oxide. An example of such a phosphor is NBG phosphor from Intematix Corporation, Fremont California, USA which has a peak emission wavelength of between about 535 nm-540 nm. Details of green sulfide phosphors are provided in co-pending PCT patent publication No. WO2018/080936 published 3 May 2018, which is hereby incorporated by reference in its entirety. The green sulfide phosphors described in PCT patent publication WO2018/080936 can be used in the present invention. For example, a narrow band green phosphor may have a composition $(M)(A)_2S_4$: Eu, M', A' where M is at least one of Mg, Ca, Sr and Ba; M' is at least one of Li, Na and K; A is at least one of Ga, Al, and In; and A' is at least one of Si, Ge, La, Y and Ti. In the latter formula the dopants Eu, M' and A' may be present in substitutional sites, although other options for incorporation are envisaged, such as interstitial sites. Furthermore, the green sulfide phosphor may have a composition $(M,M')(A,A')_2S_4$:Eu, wherein: M is at least one of Mg, Ca, Sr and Ba; M' is at least one of Li, Na and K; A is at least one of Ga, Al, In, La and Y; and A' is at least one of Si, Ge and Ti; wherein M' substitutes for M, and A' substitutes for A in the $MA_2S_4$ crystalline lattice. In the latter formula the specific substitution sites are identified, although it is envisaged that alternative substitutional sites may exist; for example, it is envisaged that for doping with Li and Si the following structure may provide an alternative substitutional site for the Li: $Sr(Ga_{1-2x}Si_xLi_{2x})_2S_4$:Eu, wherein: M is at least one of Mg, Ca, Sr and Ba; and A is at least one of Ga, Al, In, La and Y; wherein 0<x<0.1.

Quantum Dot (QD) Materials

A quantum dot (QD) is a portion of matter (e.g. semiconductor) whose excitons are confined in all three spatial dimensions that may be excited by radiation energy to emit light of a particular wavelength or range of wavelengths. QDs can comprise different materials, for example cadmium selenide (CdSe). The color of light generated by a QD is enabled by the quantum confinement effect associated with the nano-crystal structure of the QD. The energy level of each QD relates directly to the physical size of the QD. For example, the larger QDs, such as red QDs, can absorb and emit photons having a relatively lower energy (i.e. a relatively longer wavelength). On the other hand, green QDs, which are smaller in size can absorb and emit photons of a relatively higher energy (shorter wavelength). Examples of suitable QDs can include: CdZnSeS (cadmium zinc selenium sulfide), CdxZn1-x Se (cadmium zinc selenide), CdSexS1-x (cadmium selenium sulfide), CdTe (cadmium telluride), CdTexS1-x (cadmium tellurium sulfide), InP (indium phosphide), InxGa1-x P (indium gallium phosphide), InAs (indium arsenide), CuInS2 (copper indium sulfide), CuInSe2 (copper indium selenide), CuInSxSe2-x (copper indium sulfur selenide), CuInxGa1-x S2 (copper indium gallium sulfide), CuInxGal-xSe2 (copper indium gallium selenide), CuInxAl1-x Se2 (copper indium aluminum selenide), CuGaS2 (copper gallium sulfide) and CuInS2xZnS1-x (copper indium selenium zinc selenide). The QD materials can comprise core/shell nano-crystals containing different materials in an onion-like structure. For example, the above described exemplary materials can be used as the core materials for the core/shell nano-crystals. The optical properties of the core nano-crystals in one material can be altered by growing an epitaxial-type shell of another material. Depending on the requirements, the core/shell nano-crystals can have a single shell or multiple shells. The shell materials can be chosen based on the band gap engineering. For example, the shell materials can have a band gap larger than the core materials so that the shell of the nano-crystals can separate the surface of the optically active core from its surrounding medium. In the case of the cadmium-based QDs, e.g. CdSe QDs, the core/shell quantum dots can be synthesized using the formula of CdSe/ZnS, CdSe/CdS, CdSe/ZnSe, CdSe/CdS/ZnS, or CdSe/ZnSe/ZnS. Similarly, for CuInS2 quantum dots, the core/shell nanocrystals can be synthesized using the formula of CuInS2/ZnS, CuInS2/CdS, CuInS2/CuGaS2, CuInS2/CuGaS2/ZnS and so on.

Examples of suitable quantum dots composition are given in Table 3.

TABLE 3

| Quantum dot composition | |
|---|---|
| Green (525 nm-545 nm) | Red (610 nm-650 nm) |
| CdSe ~2.9 nm | CdSe ~4.2 nm |
| $Cd_xZn_{1-x}$ Se | $Cd_xZn_{1-x}$ Se |
| CdZnSeS | CdZnSeS |
| $CdSe_xS_{1-x}$ | $CdSe_xS_{1-x}$ |
| CdTe | CdTe |
| $CdTe_xS_{1-x}$ | $CdTe_xS_{1-x}$ |
| CdS | — |
| InP | InP |
| $In_xGa_{1-x}$ P | $In_xGa_{1-x}$ P |
| — | InAs |
| $CuInS_2$ | $CuInS_2$ |
| $CuInSe_2$ | $CuInSe_2$ |
| $CuInS_xSe_{2-x}$ | $CuInS_xSe_{2-x}$ |
| Cu $In_xGa_{1-x}$ $S_2$ | Cu $In_xGa_{1-x}$ $S_2$ |
| Cu $In_xGal$, $Se_2$ | Cu $In_xGal$, $Se_2$ |
| CuGaS2 | CuGaS2 |
| Cu $In_xAl_{1-x}$ $Se_2$ | Cu $In_xAl_{1-x}$ $Se_2$ |
| Cu $Ga_xAl_{1-x}$ $Se_2$ | — |
| $CuInS_{2x}ZnS_{1-x}$ | $CuInS_{2x}ZnS_{1-x}$ |
| $CuInSe_{2x}ZnSe_{1-x}$ | $CuInSe_{2x}ZnSe_{1-x}$ |

Figure 16:
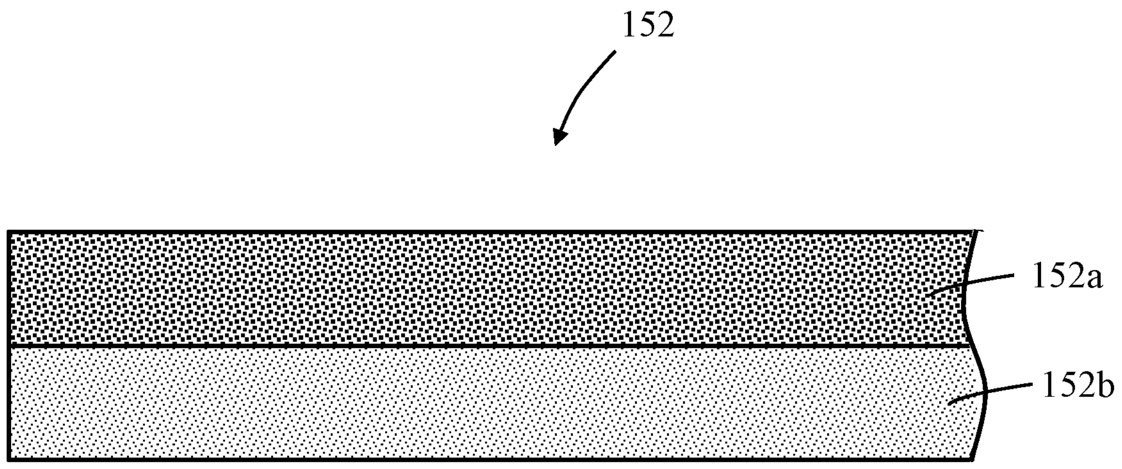
FIG. 16 is a schematic side view of a photoluminescence layer according to some embodiments.

There are a variety of ways of implementing backlights in accordance with the invention. For example, as described above, in some embodiments the red-emitting photoluminescence material can be located in the light emitting device 146 and the green-emitting photoluminescence material located in the photoluminescence layer 152. In other embodiments the green-emitting photoluminescence material can be located in the light emitting device 146 and the red-emitting photoluminescence material located in the photoluminescence layer 152. It is contemplated, in other embodiments, to locate both the red-emitting and the green-emitting photoluminescence material in the photoluminescence layer 152. It will be appreciated that in such arrangements the light emitting device 146 need not include red-emitting and green-emitting photoluminescence materials and that the light emitting device 146 may generate only blue excitation light. In some arrangements, the red-emitting and the green-emitting photoluminescence materials can be incorporated in the photoluminescence layer 152 as a mixture. In other arrangements, the red-emitting and the green-emitting photoluminescence materials can be incorporated in separate respective photoluminescence layers **152*a*, 152*b* (FIG. 16**). In the context of this specification, "photoluminescence layer" contemplates both a single layer and multiple layers; that is "photoluminescence layer" includes "photoluminescence layers". Regardless of the location of the red and green photoluminescence materials, the photoluminescence layer can be implemented in a number of ways.

In some embodiments, the photoluminescence layer 152 is disposed adjacent to the BEF 154. When using inorganic phosphor materials, the red-emitting or green-emitting phosphors, which are in the form of particles, can be incorporated as a mixture in a curable light transmissive liquid binder material and the mixture deposited as a uniform layer on a light transmissive substrate using for example screen printing or slot die coating. In some embodiments, the BEF 154 can comprise the light transmissive substrate and the photoluminescence layer 152 can be deposited directly onto the BEF 154. In this patent specification, depositing directly means in direct contact with, in that is there is no intervening layer or air gap between the layers. When depositing the photoluminescence layer using screen printing, the light transmissive binder material can comprise for example a light transmissive UV-curable acrylic adhesive such as UVA4103 clear base from STAR Technology of Waterloo, Indiana USA. An advantage of depositing the photoluminescence layer directly onto the BEF is that this can increase light emission from the backlight by eliminating an air interface between the photoluminescence layer and BEF. Such an air interface could otherwise lead to a greater probability of internal reflection of light within the photoluminescence layer and reduce light coupling into the BEF.

In other embodiments, the photoluminescence layer 152 can be fabricated as a separate film and the resulting film disposed between the lightguide 144 and BEF 154. Fabricating the photoluminescence layer separately can be advantageous when the lower face of the BEF 154 includes a pattern of features or surface texturing.

For example, in one arrangement, the red- or green-emitting phosphors and light transmissive material are deposited, for example, by screen printing as a uniform layer onto a light transmissive film, such as for example Mylar™. In other embodiments, the red- or green-emitting phosphors can be incorporated in and homogeneously distributed throughout a film which can then be applied to the BEF 154.

In other embodiments, the photoluminescence layer 152 can be disposed adjacent to the light guide 144. For example in FIG. 7 the photoluminescence layer 152 is disposed between the light guide 144 and the BEF 154 adjacent to the front light emitting face (upper face as shown that faces the Display Panel) of the light guide 144. In some embodiments, the photoluminescence layer 152 can be deposited directly onto the front light emitting face of the light guide 144. An advantage of depositing the photoluminescence layer directly onto the front face of the light guide is that this can increase overall light emission from the backlight through the elimination an air interface between the light guide and photoluminescence layer. Such an air interface, if present, could reduce light coupling from the light guide into the photoluminescence layer and reduce overall light emission from the backlight.

In other embodiments, the photoluminescence layer 152 can be fabricated as a separate film and the resulting film then applied to the front light emitting face of the light guide 144. Such an arrangement can be advantageous when the front light emitting face of the light guide 144 includes a pattern of features or texturing that is used to aid in a uniform light extraction of light from the light guide.

Figure 8:
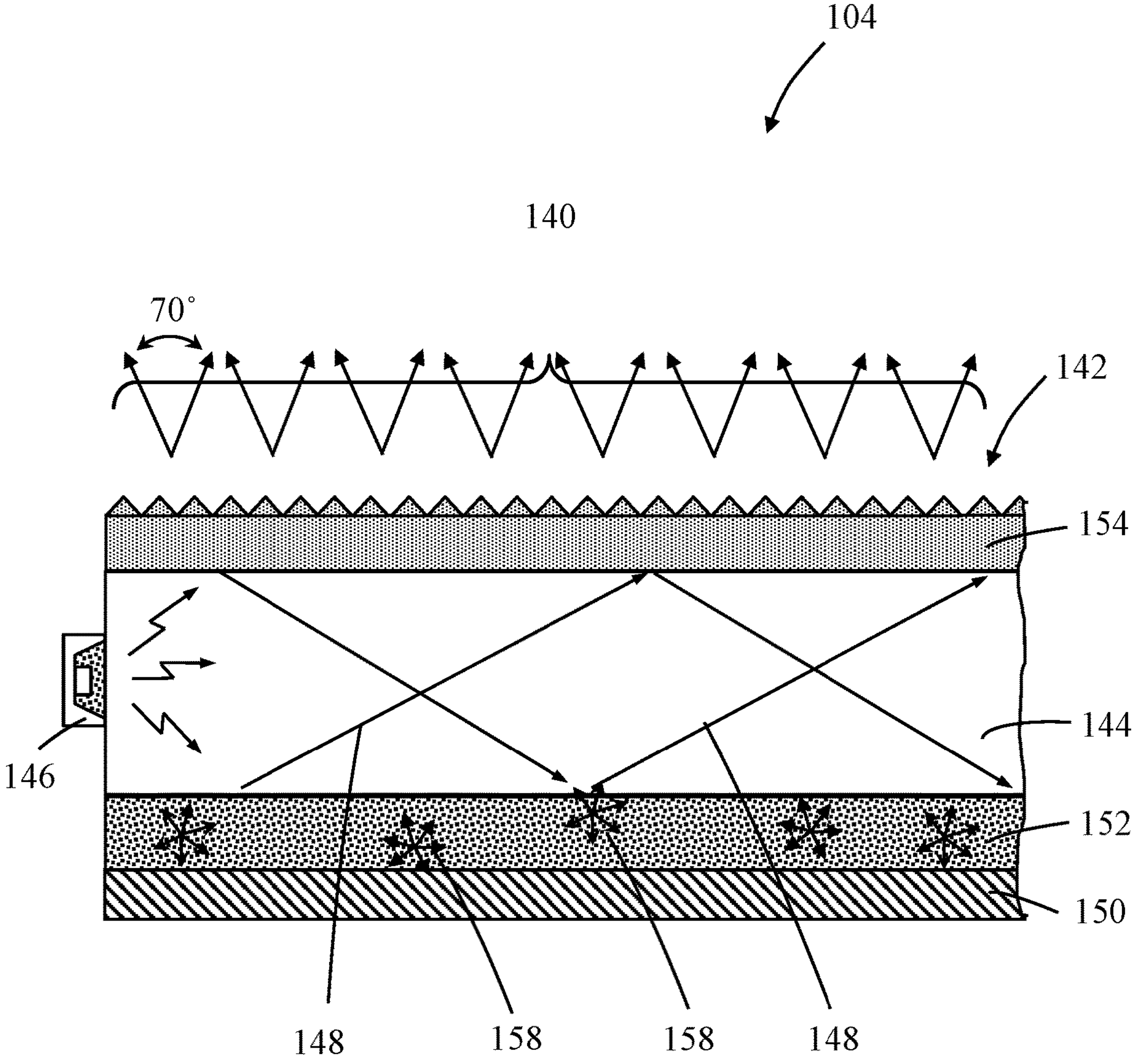
FIG. 8 is a schematic cross-sectional representation of an edge-lit backlight in accordance with an embodiment of the invention in which a photoluminescence layer is located between a light guide and a light reflective layer.

In other embodiments, and as indicated in FIG. 8 the photoluminescence layer 152 is disposed between the rear face (lower face as shown) of the light guide 144 and the light reflective layer 150. In some embodiments, the photoluminescence layer 152 can be deposited directly onto the rear face of the light guide 144. An advantage of depositing the photoluminescence layer directly onto the rear face of the light guide is that this can increase overall light emission from the backlight through the elimination an air interface between the light guide and photoluminescence layer. Such an air interface, if present, could reduce light coupling from the light guide into photoluminescence layer and reduce overall light emission from the backlight.

In other embodiments, the photoluminescence layer 152 can be deposited directly onto the light reflective layer 150. An advantage of depositing the photoluminescence layer directly onto the light reflective layer 150 is that this can increase overall light emission from the backlight through the elimination an air interface between the photoluminescence layer and light reflective layer. Such an air interface if present, could reduce backward directed light being reflected back in a direction towards the light emitting face 142 of the backlight.

In yet other embodiments the photoluminescence layer 152 can be fabricated as a separate film and the resulting film then applied to the rear face of the light guide 144. Such an arrangement can be advantageous when the rear emitting face of the light guide 144 includes a pattern of features of texturing to aid in a uniform light extraction of light from the light guide.

An advantage of having a photoluminescence layer as compared with known displays that utilize white LEDs, is that due to the light diffusive nature of phosphor materials this can eliminate the need for a separate light diffusive layer and the associated interface losses and thereby increase display efficacy as well as reducing production costs.

However, due to the isotropic nature of photoluminescence light generation, photoluminescence light 158 by the red- or green-emitting phosphors in the photoluminescence layer will be emitted in all directions including directions towards the light guide 144. To reduce the likelihood of such light reaching the light guide 144, the backlight can further comprise a light diffusive layer disposed between the photoluminescence layer 152 and the light guide 144.

Figure 9:
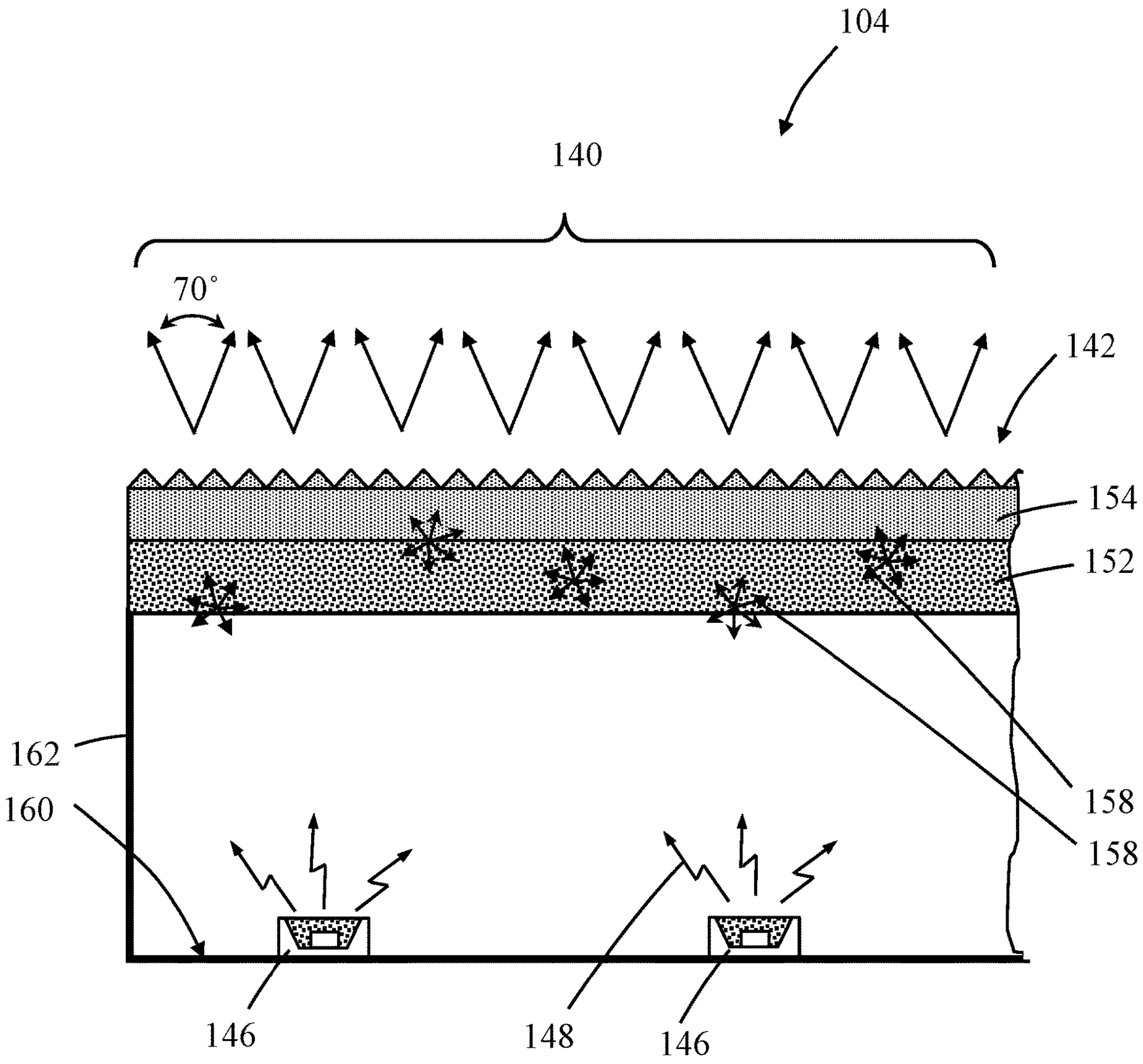
FIG. 9 is a schematic exploded cross-sectional representation of a direct-lit backlight in accordance with an embodiment of the invention.

While in the foregoing embodiments the backlight has been an edge-lit arrangement utilizing a light guide, the invention finds utility in direct-lit backlights that comprise an array of light emitting devices configured over the surface of the LC display panel. FIG. 9 illustrates such an embodiment in which an array of light emitting devices 146 containing one of the red- or green-emitting phosphors are provided on the floor 158 of a light reflective enclosure 160 and a separate photoluminescence layer 152 provided overlaying the enclosure.

In any of the embodiments described (FIGS. 6-8) the photoluminescence layer 152 can further incorporate particles of a light scattering (diffusive) material, preferably zinc oxide (ZnO). The light diffusive material can comprise silicon dioxide (SiO2), titanium dioxide (TiO2), magnesium oxide (MgO), barium sulfate (BaSO4), aluminum oxide (Al2O3) or combinations thereof. Inclusion of a light scattering material can increase uniformity of light emission from the photoluminescence layer and can eliminate the need for a separate light diffusive layer. Additionally, incorporating particles of a light scattering material with the red- or green-emitting phosphor can result in an increase in light generation by the photoluminescence layer and a substantial, up to 40%, reduction in the quantity of phosphor materials required to generate a given color of light. Given the relatively high cost of phosphor materials, inclusion of an inexpensive light scattering material can result in a significant reduction in manufacturing cost for larger displays such a tablet computers, laptops, TVs and monitors. Further details of an exemplary approach to implement scattering particles are described in U.S. Pat. No. 8,610,340 issued Dec. 17, 2013, which is hereby incorporated by reference in its entirety. The size of the light scattering particles can be selected to scatter excitation light relatively more than light generated by the phosphor. In some embodiments, the light scattering material particles have an average diameter (D50) of 200 nm of less, typically 100 nm to 150 nm.

As described above, due to the isotropic nature of photoluminescence light generation, photoluminescence light 158 160 will be emitted in all directions including emission in directions towards the light guide 144. To reduce the likelihood of such light reaching the light guide 144, the backlight can in some embodiments further comprise a light diffusive layer disposed between the photoluminescence layer 152 and the light guide 144 even when the photoluminescence layer 152 already includes light scattering material. In other embodiments the photoluminescence layer 152 and light diffusive layer can be fabricated as separate films and the films then applied to one another.

Example Color Display Backlights

Table 4 tabulates details of preferred example backlights in accordance with the invention for use in high color gamut LCD television. The example backlights preferably comprise the edge-lit configuration illustrated in FIG. 7.

TABLE 4

| Example backlights | | | | |
|---|---|---|---|---|
| | Red and green photoluminescence materials | | | |
| Back- | Device 146 | | Photoluminescence layer 152 | |
| light | Material | $\lambda_{pe}$ (nm) | Material | $\lambda_{pe}$ (nm) |
| BL.1 | $K_2SiF_6$:$Mn^{4+}$ (KSF) | 632 | SrGa2S4:Eu | 536 |
| BL.2 | $K_2SiF_6$:$Mn^{4+}$ (KSF) | 632 | ZnS coated InP (QD) | 538 |
| BL.3 | $K_2SiF_6$:$Mn^{4+}$ (KSF) | 632 | ZnS coated CdSe (QD) | 533 |
| BL.4 | $K_2GeF_6$:$Mn^{4+}$ (KGF) | 632 | $SrGa_2S_4$:Eu | 525-545 |
| BL.5 | $K_2TiF_6$:$Mn^{4+}$ (KTF) | 632 | $SrGa_2S_4$:Eu | 525-545 |
| BL.6 | CASN | 630-650 | $SrGa_2S_4$:Eu | 525-545 |

TABLE 4-continued

| Example backlights | | | | |
|---|---|---|---|---|
| | Red and green photoluminescence materials | | | |
| Back- | Device 146 | | Photoluminescence layer 152 | |
| light | Material | $\lambda_{pe}$ (nm) | Material | $\lambda_{pe}$ (nm) |
| BL.7 | CASN | 630-650 | β-SiAlON | 525-545 |
| BL.8 | β-SiAlON | 525-545 | CaSeS:Eu (CSS) | 630 |

In the example denoted BL.1, the red-emitting phosphor comprises a narrow-band red-emitting manganese-activated potassium hexafluorosilicate phosphor of composition K2SiF6:Mn4+ (KSF), peak emission wavelength λpe=632 nm, and is located in the light emitting device 146. The light emitting device 146 comprises a 7020 cavity package containing two 300 mW GaN LED chips with a dominant emission wavelength of 453 nm. The KSF phosphor is incorporated in, and homogeneously distributed throughout, a UV curable light transmissive silicone encapsulant (e.g. Dow Corning OE-6370 HF optical encapsulant) and the mixture deposited in the cavity recess such as to cover the LED chip.

In BL.1 the green-emitting phosphor comprises a narrow-band green-emitting strontium gallium sulfide phosphor of composition SrGa2S4:Eu, peak emission wavelength λpe=536 nm and is located in photoluminescence layer 152. The green-emitting phosphor is incorporated in, and homogeneously distributed throughout a UV curable light transmissive acrylic binder (UVA4103 from STAR Technology) and the mixture screen printed as a ≈50 μm thickness layer on a ≈140 μm light transmissive PET (Polyethylene terephthalate) film.

Figure 10:
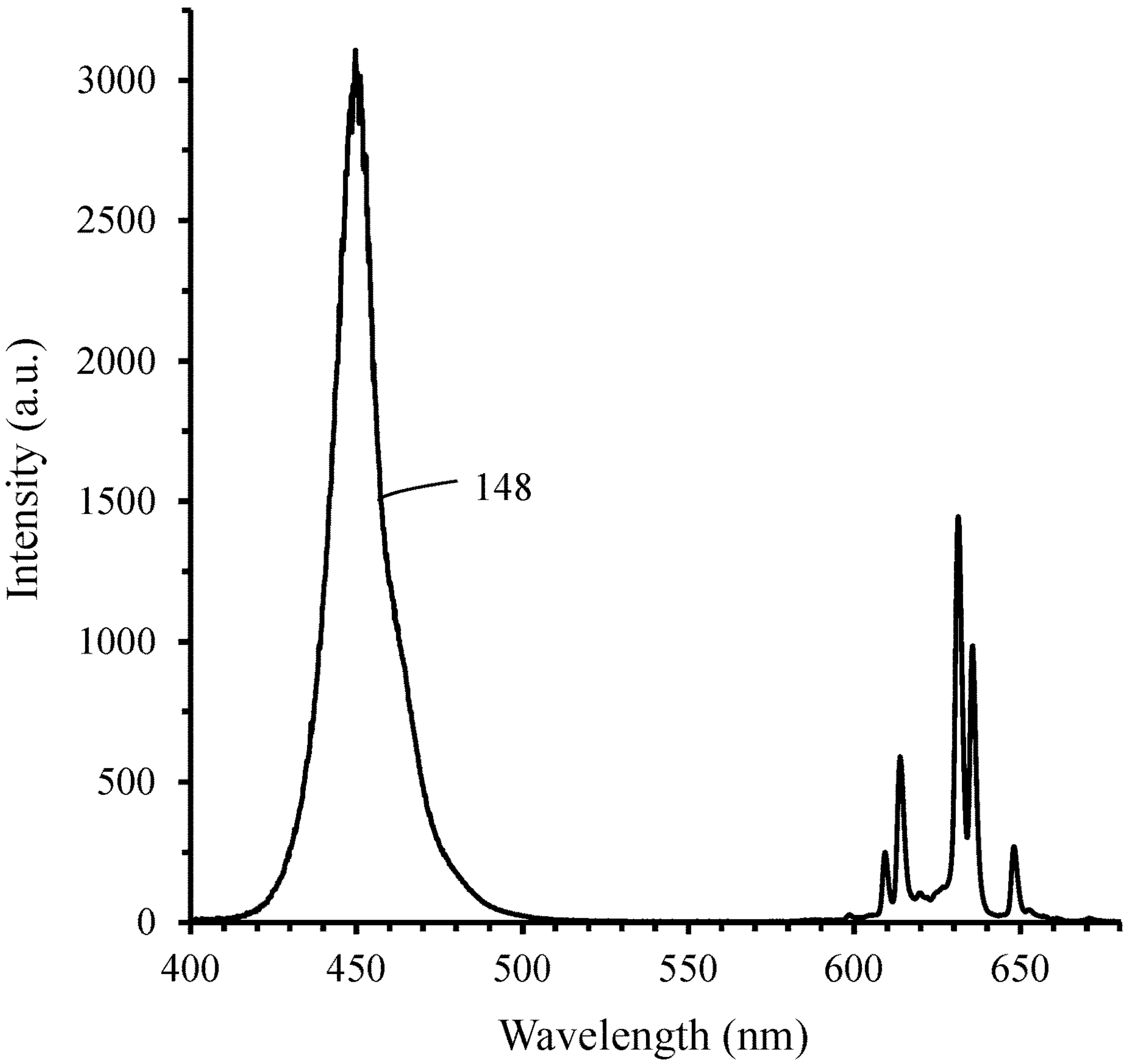
FIG. 10 shows emission spectrum, intensity (a.u.) versus wavelength (nm), for a light emitting device in accordance with an embodiment of the invention.

FIG. 10 shows emission spectrum, intensity (a.u.) versus wavelength (nm), for the light emitting device 146 of BL.1.

Figure 11:
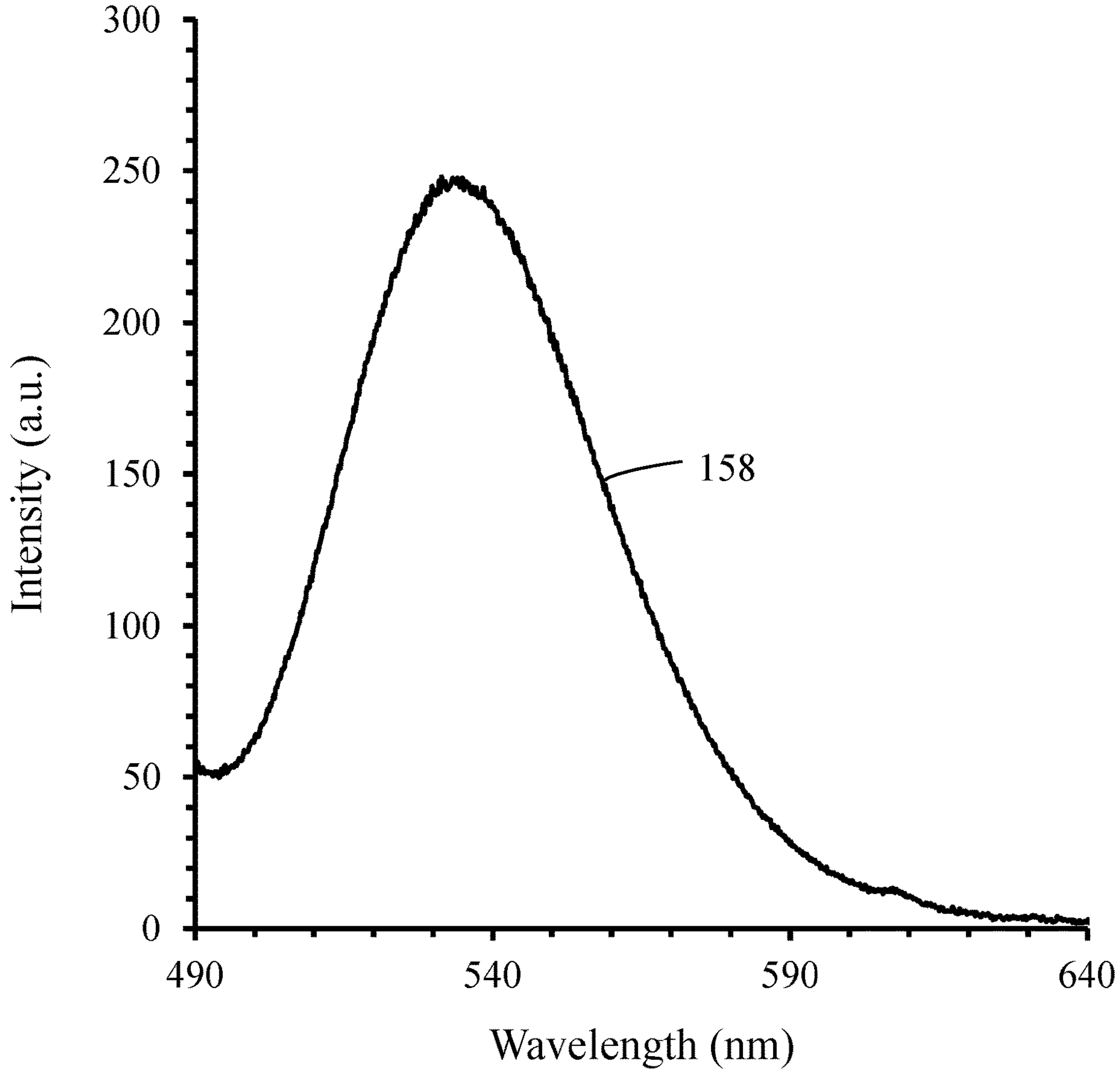
FIG. 11 shows emission spectrum, intensity (a.u.) versus wavelength (nm), for a photoluminescence wavelength converting layer in accordance with an embodiment of the invention.

FIG. 11 shows emission spectrum, intensity (a.u.) versus wavelength (nm), for the photoluminescence wavelength converting layer 152 of BL.1.

Figure 12:
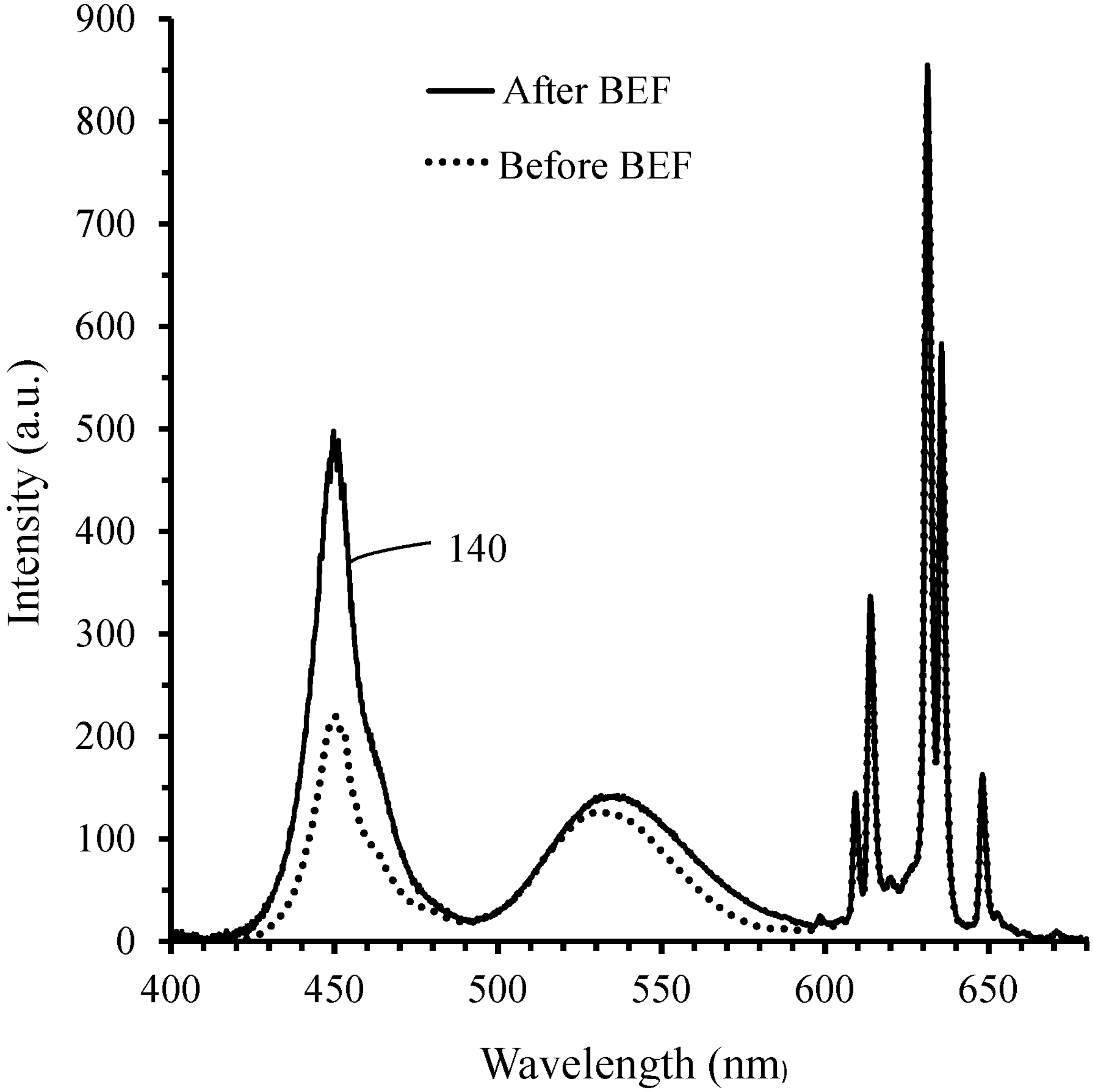
FIG. 12 shows emission spectrum, intensity (a.u.) versus wavelength (nm), for a backlight in accordance with an embodiment of the invention before and after the BEF.

FIG. 12 shows emission spectrum, intensity (a.u.) versus wavelength (nm), for backlight BL.1 before and after the BEF 154.

Figure 13:
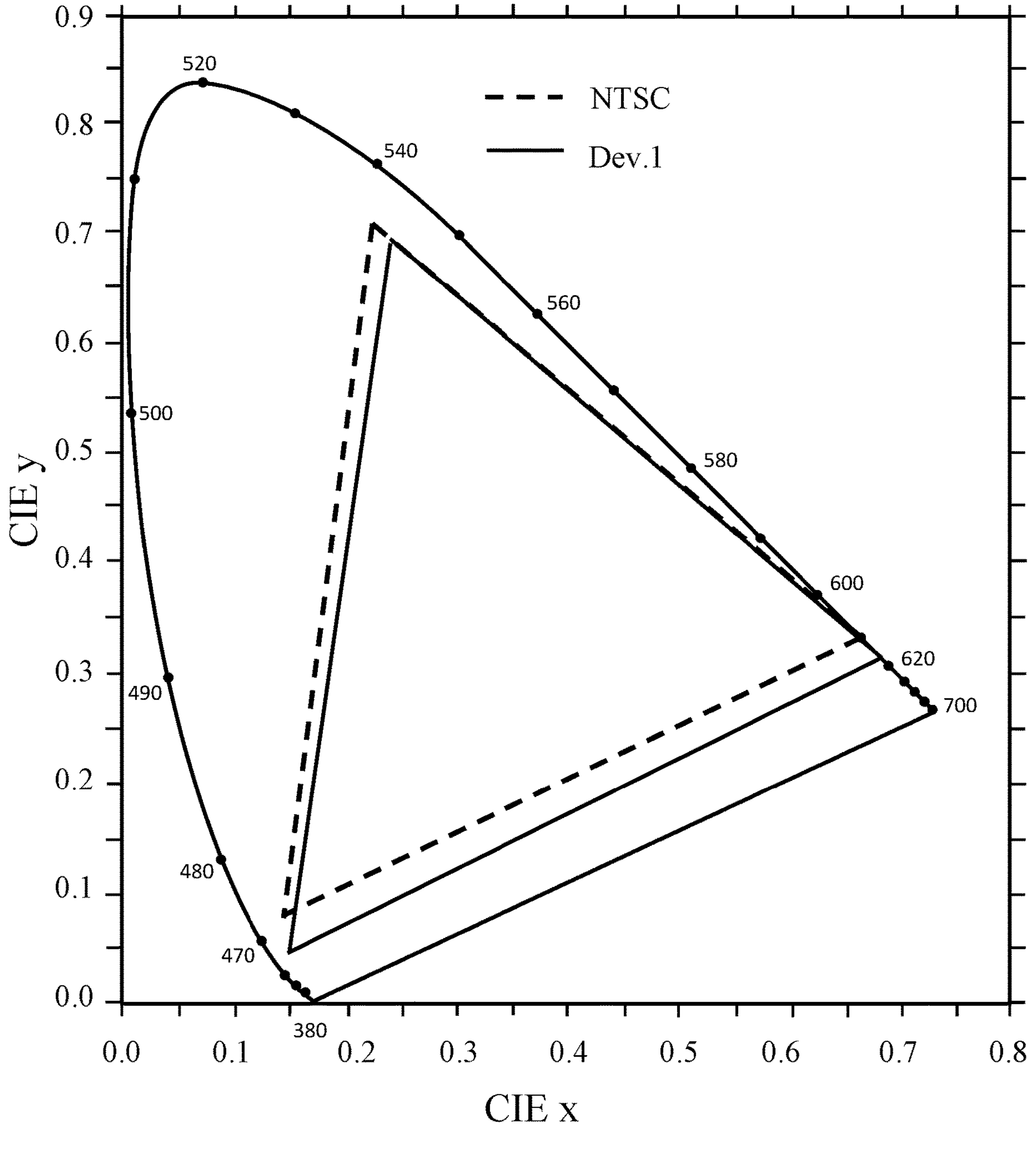
FIG. 13 shows the 1931 CIE color coordinates of the NTSC standard and RGB color coordinates of a backlight according to some embodiments.

FIG. 13 shows the 1931 CIE color coordinates of the NTSC (National Television System Committee) colorimetry 1953 (CIE 1931) standard and RGB color coordinates of the backlight BL.1.

Table 5 tabulates the optical characteristics of the backlight BL.1. An AUO (AU Optronics Corp.) high color gamut color filter characteristic was used to calculate the Red, Green and Blue emission spectra of an LCD display incorporating the backlight BL.1. As can be seen from Table 5 backlight BL.1 in accordance with the invention can produce light with color gamut of 100.7% (area) of the NTSC and 104.7% of DCI-P3 RGB color space standards. For comparison known high color gamut LCD display utilizing phosphors have a DCI-P3 of 99% to 100%. More specifically test have shown that backlights in accordance with the invention have an emission spectrum comprising red, green and blue emission peaks in which the red peak has chromaticity coordinates CIE x=0.6700 to 0.6950, CIE y=0.3300 to 0.2950; the green peak has chromaticity coordinates CIE x=0.1950 to 0.2950, CIE y=0.7250 to 0.6250; and the blue peak has chromaticity coordinates CIE x=0.1600 to 0.1400, CIE y=0.0180 to 0.0600.

TABLE 5

Optical characteristics of backlight BL.1
Drive condition: $I_f$ = 20 mA, $V_f$ = 5.2 V: Values for backlight tuned to NTSC white point

| Parameter | Value |
|---|---|
| Backlight CIE x after BEF & before color filter | 0.2783 |
| Backlight CIE y after BEF & before color filter | 0.2482 |
| Backlight brightness (lm) after BEF & before color filter | 6.18 |
| LCD white CIE x | 0.3260 |
| LCD white CIE y | 0.3213 |
| LCD Brightness (lm) | 5.07 |
| Brightness LCD/backlight (%) | 82.1 |
| Red CIE x after LCD red filter | 0.6923 |
| Red CIE y after LCD red filter | 0.3075 |
| Green CIE x after LCD green filter | 0.2361 |
| Green CIE y after LCD green filter | 0.6723 |
| Blue CIE x after LCD blue filter | 0.1495 |
| Blue CIE y after LCD blue filter | 0.0429 |
| NTSC (%) | 100.7 |
| DCI-P3 (%) | 104.9 |

Figure 14:
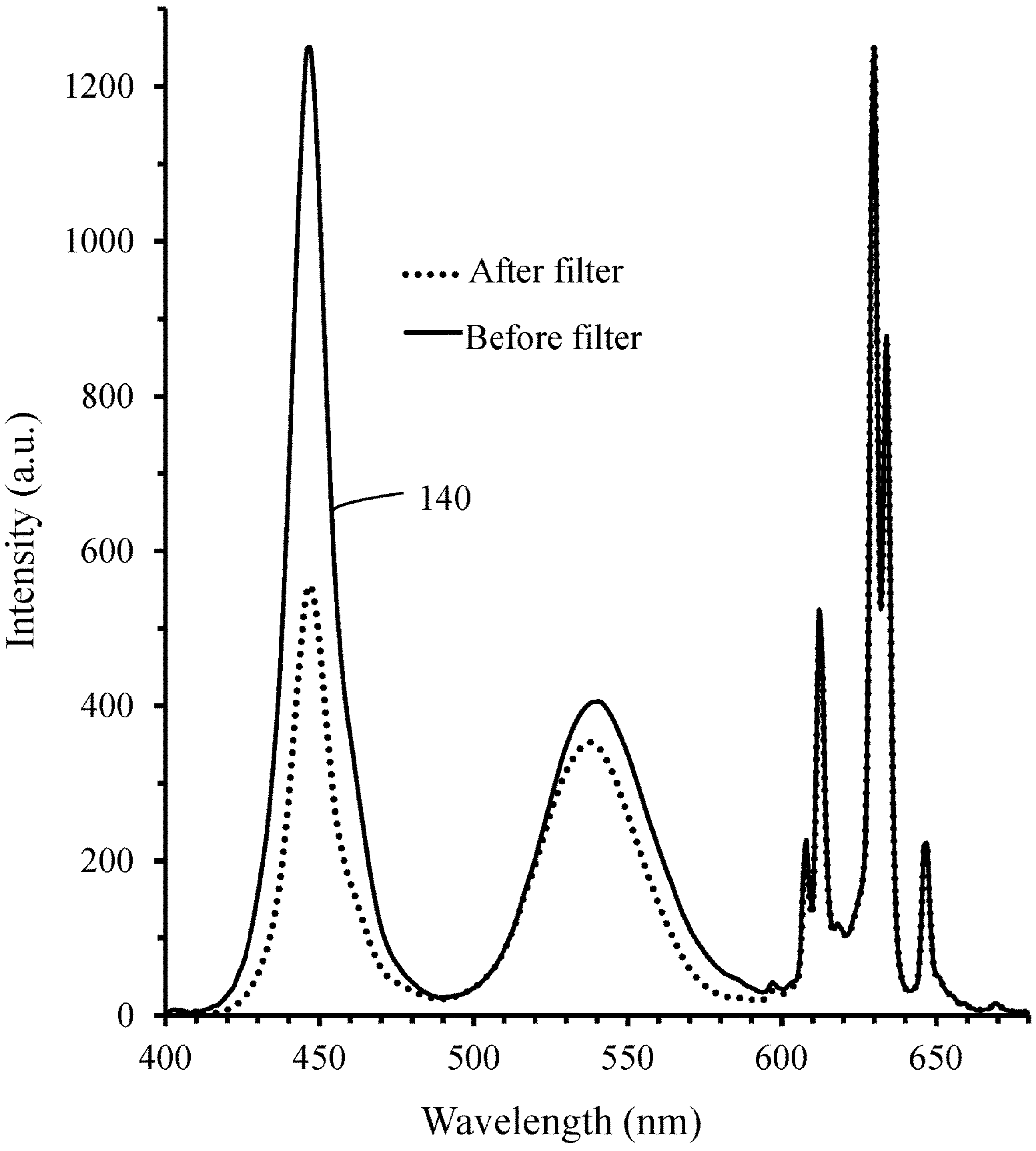
FIG. 14 shows emission spectrum, intensity (a.u.) versus wavelength (nm), for backlight BL.2 (tuned to DCI-P3 white point) before and after the AUO color filter.

Table 6 tabulates the optical characteristics of the backlight BL.2. An AUO (AU Optronics Corp.) high color gamut color filter characteristic was used to calculate the Red, Green and Blue emission spectra of an LCD display incorporating the backlight BL.2. As can be seen from Table 6 backlight BL.1 in accordance with the invention can produce light with color gamut of 102.2% (area) of the NTSC and 106.6% of DCI-P3 RGB color space standards. FIG. 14 shows emission spectrum, intensity (a.u.) versus wavelength (nm), for backlight BL.2 (tuned to DCI-P3 white point) before and after the AUO color filter 120.

TABLE 6

Optical characteristics of backlight BL.2 tuned to DCI-P3 and NTSC white points
Drive condition: $I_f$ = 20 mA, $V_f$ = 5.2 V

| | Value | |
|---|---|---|
| Parameter | Tuned to DCI-P3 | Tuned to NTSC |
| Backlight CIE x after BEF & before color filter | 0.2677 | 0.2637 |
| Backlight CIE y after BEF & before color filter | 0.2456 | 0.2336 |
| Backlight brightness (lm) after BEF & before color filter | 14.44 | 14.61 |
| LCD white CIE x | 0.3141 | 0.3107 |
| LCD white CIE y | 0.3268 | 0.3149 |
| LCD Brightness (lm) | 11.78 | 11.91 |
| Brightness LCD/backlight (%) | 81.5 | 81.5 |
| Red CIE x after LCD red filter | 0.6901 | 0.6902 |
| Red CIE y after LCD red filter | 0.3098 | 0.3096 |
| Green CIE x after LCD green filter | 0.2481 | 0.2477 |
| Green CIE y after LCD green filter | 0.6873 | 0.6848 |
| Blue CIE x after LCD blue filter | 0.1544 | 0.1545 |
| Blue CIE y after LCD blue filter | 0.0345 | 0.0332 |
| NTSC (%) | — | 102.2 |
| DCI-P3 (%) | 106.6 | — |

Figure 15:
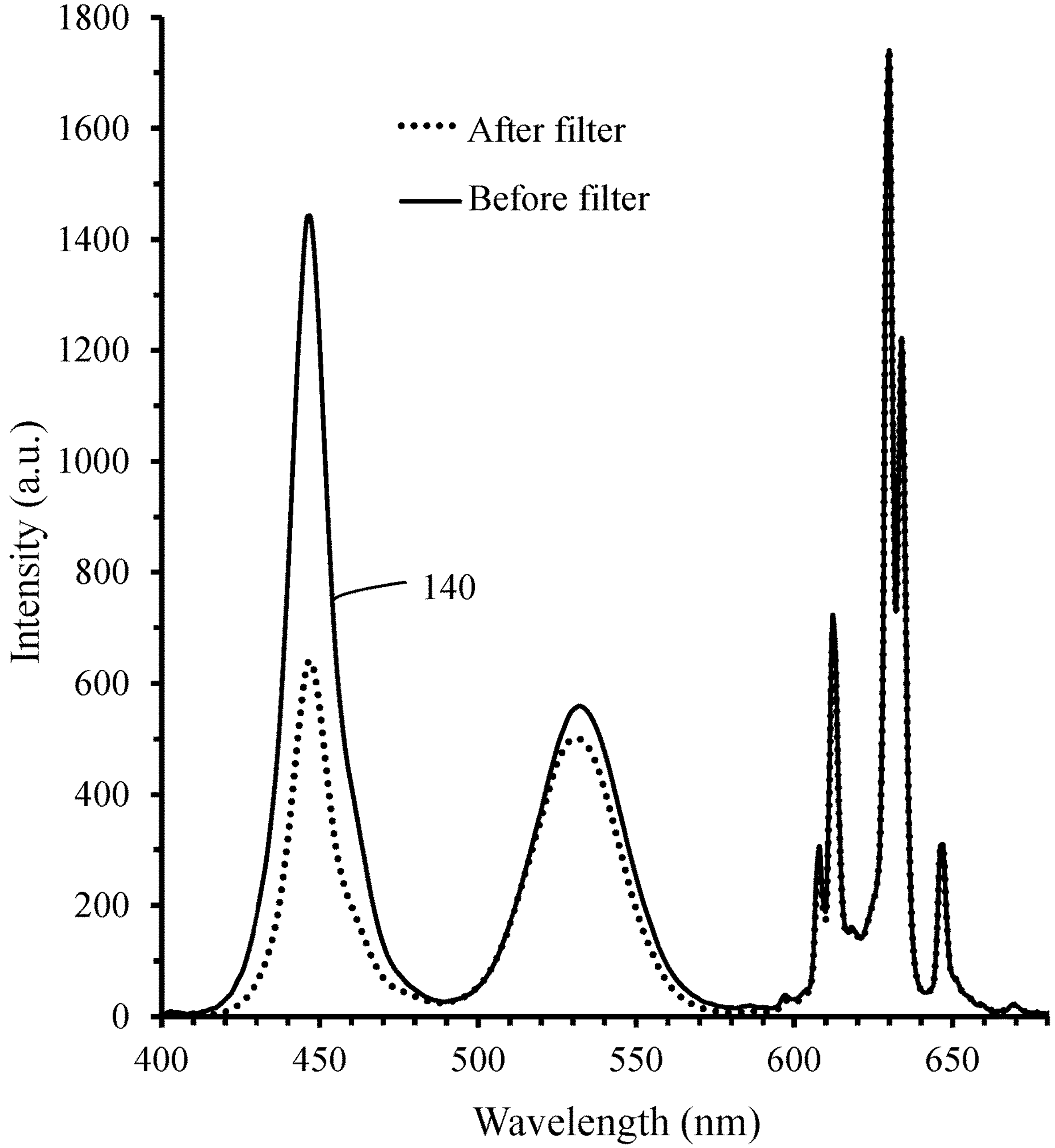
FIG. 15 shows emission spectrum, intensity (a.u.) versus wavelength (nm), for backlight BL.3 (tuned to DCI-P3 white point) before and after the AUO color filter.

Table 7 tabulates the optical characteristics of the backlight BL.3. An AUO (AU Optronics Corp.) high color gamut color filter characteristic was used to calculate the Red, Green and Blue emission spectra of an LCD display incorporating the backlight BL.3. As can be seen from Table 7 backlight BL.1 in accordance with the invention can produce light with color gamut of 112.3% (area) of the NTSC and 117.2% of DCI-P3 RGB color space standards. FIG. 15 shows emission spectrum, intensity (a.u.) versus wavelength (nm), for backlight BL.3 (tuned to DCI-P3 white point) before and after the AUO color filter 120.

TABLE 7

| Optical characteristics of backlight BL.3 tuned to DCI-P3 and NTSC white points Drive condition: $I_f$ = 20 mA, $V_f$ = 5.2 V | | |
|---|---|---|
| | Value | |
| Parameter | Tuned to DCI-P3 | Tuned to NTSC |
| CIE x after BEF & before color filter | 0.2633 | 0.2601 |
| CIE y after BEF & before color filter | 0.2392 | 0.2271 |
| Brightness (lm) after BEF & before color filter | 15.97 | 15.85 |
| LCD white CIE x | 0.3135 | 0.3110 |
| LCD white CIE y | 0.3284 | 0.3157 |
| LCD Brightness (lm) | 13.86 | 13.75 |
| Brightness LCD/backlight (%) | 86.8 | 86.6 |
| Red CIE x after LCD red filter | 0.6934 | 0.6934 |
| Red CIE y after LCD red filter | 0.3065 | 0.3064 |
| Green CIE x after LCD green filter | 0.1962 | 0.1962 |
| Green CIE y after LCD green filter | 0.7211 | 0.7180 |
| Blue CIE x after LCD blue filter | 0.1537 | 0.1539 |
| Blue CIE y after LCD blue filter | 0.0402 | 0.0383 |
| NTSC (%) | — | 112.3 |
| DCI-P3 (%) | 117.2 | — |

More specifically test have shown that backlights in accordance with the invention have an emission spectrum comprising red, green and blue emission peaks in which the red peak has chromaticity coordinates CIE x=0.6700 to 0.6950, CIE y=0.3300 to 0.2950; the green peak has chromaticity coordinates CIE x=0.1950 to 0.2950, CIE y=0.7250 to 0.6250; and the blue peak has chromaticity coordinates CIE x=0.1600 to 0.1400, CIE y=0.0180 to 0.0600.

Table 8 tabulates RGB color space values for NTSC (National Television System Committee) colorimetry 1953 (CIE 1931) and DCI-P3 (Digital Cinema Initiatives) RGB color space standards.

TABLE 8

| NTSC (National Television System Committee) and DCI (Digital Cinema Initiatives) RGB color space (color gamut) standards | | | | | | | | |
|---|---|---|---|---|---|---|---|---|
| | Red | | Green | | Blue | | White point | |
| Standard | CIE x | CIE y | CIE x | CIE y | CIE x | CIE y | CIE x | CIE y |
| NTSC | 0.6700 | 0.3300 | 0.2100 | 0.7100 | 0.1400 | 0.0800 | 0.3101 | 0.3162 |
| DCI-P3 | 0.6800 | 0.3200 | 0.2650 | 0.6900 | 0.1500 | 0.0600 | 0.3127 | 0.3290 |

It will be appreciated that the present invention is not restricted to the specific embodiments described and that variations can be made that are within the scope of the invention.

For example while in the foregoing embodiments one or both of the red-emitting and/or green-emitting photoluminescence materials is located in the photoluminescence layer, it is envisaged in further embodiments to locate the red-emitting and/or green-emitting photoluminescence materials in the one or more light emitting devices thereby eliminating the need for a photoluminescence layer. Such an arrangement is found to be particularly advantageous where the green-emitting photoluminescence material comprises a europium activated sulfide phosphor. Further, it is also advantageous where the red-emitting photoluminescence material comprises a manganese-activated fluoride phosphor. In some arrangements, the red-emitting and the green-emitting photoluminescence materials can be incorporated in the same light emitting device in the form of a mixture or in separate locations/layers in the same light emitting device. In other arrangements, the red-emitting and the green-emitting photoluminescence materials can be located in separate respective light emitting devices. The inventors have discovered that such an arrangement can increase luminous efficacy, and offers the advantages of reduced complexity, ease of manufacture and reduced manufacturing costs.

REFERENCE NUMERALS

42 LED chip
44 Upper body part
46 Lower body part
48 Recess
50 Electrical connector
52 Electrical connector
54 Contact pad
56 Contact pad
58 Thermally conductive pad
60 Bond wire
62 Bond wire
100 Color LCD
102 LC Display Panel
104 Edge-lit backlight
106 Front plate
108 Back plate
110 Liquid Crystal (LC)
112 Glass plate
114 Viewing face
116 First polarizing filter layer
118 Anti-reflective layer
120 Color filter plate
122 Light transmissive common electrode plane
124 Red sub-pixel filter element
126 Green sub-pixel filter element
128 Blue sub-pixel filter element
130 Unit pixel
132 Opaque divider/black matrix
134 Glass plate
136 TFT
138 Second polarizing filter layer
140 White Light
142 Light emitting face of Backlight
144 Light guide
146 Light emitting device
148 Composite light
150 Light reflective layer
152 Photoluminescence wavelength converting layer (photoluminescence layer)
154 Brightness Enhancement Film (BEF)
156 Light diffusive layer
158 Photoluminescence light
160 Floor of light reflective enclosure
162 Light reflective enclosure

What is claimed is:

1. A display comprising:

a display panel and a backlight for generating light comprising a combination of a blue light, a red light, and a green light;

wherein the backlight comprises:

an excitation source for generating the blue light with a wavelength of maximum intensity in a range from 445 nm to 465 nm; and a wavelength converting phosphor film comprising a first layer containing $K_2SiF_6:Mn^{4+}$ or $K_2GeF_6:Mn^{4}$ for converting at least a part of the blue light to the red light with a wavelength of maximum intensity in a range from 610 nm to 650 nm, and a second layer containing $SrGa_2S_4:Eu$ for converting at least a part of the blue light to the green light with a wavelength of maximum intensity in a range from 525 nm to 545 nm;

wherein the wavelength converting phosphor film is located remotely to the excitation source and disposed between the excitation source and the display panel, and the wavelength converting phosphor film has an optical path such that the blue light enters the first layer and unconverted blue light then passes into the second layer.

2. The display of claim 1, wherein the wavelength converting phosphor film comprises a light transmissive binder incorporating the $K_2SiF_6:Mn^{4+}$ or $K_2GeF_6:Mn^{4}$ and the $SrGa_2S_4:Eu$.

3. The display of claim 1, wherein the wavelength converting phosphor film comprises particles of a light scattering material.

4. The display of claim 3, wherein the particles of light scattering material are selected from the group consisting of: zinc oxide (ZnO); silicon dioxide (SiO2); titanium dioxide (TiO2); magnesium oxide (MgO); barium sulfate (BaSO4); aluminum oxide (Al2O3) and combinations thereof.

5. The display of claim 1, wherein the wavelength converting phosphor film is of a size corresponding to the size of the display panel.

6. The display of claim 1, wherein the backlight has an emission spectrum with a color gamut of at least 110% of NTSC RGB color space standard.

7. The display of claim 1, wherein the backlight has an emission spectrum comprising red, green and blue emission peaks, wherein the red peak has chromaticity coordinates CIE x=0.6700 to 0.6950, CIE y=0.2950 to 0.3300; the green peak has chromaticity coordinates CIE x=0.1950 to 0.2950, CIE y=0.6250 to 0.7250; and the blue peak has chromaticity coordinates CIE x=0.1400 to 0.1600, CIE y=0.0180 to 0.0600.

8. The display of claim 1, wherein the backlight has an emission spectrum comprising red and green emission peaks, wherein the red peak has chromaticity coordinates CIE x=0.6934, CIE y=0.3064 to 0.3065; and the green peak has chromaticity coordinates CIE x=0.1962, CIE y=0.7180 to 0.7211.

9. The display of claim 1, wherein the backlight further comprising a light guide, wherein the excitation source is configured to couple the blue light into at least one edge of the light guide and wherein the wavelength converting phosphor film is located adjacent to a face of the light guide.

10. The display of claim 1, wherein the backlight further comprising a brightness enhancement film and wherein the wavelength converting phosphor film is located adjacent to the brightness enhancement film.

11. The display of claim 1, wherein said backlight has an emission spectrum with a color gamut of at least one of: at least 95% of NTSC RGB color space standard, or at least 100% of DCI-P3 RGB color space standard.

* * * * *